(12) United States Patent
Kundu et al.

(10) Patent No.: US 10,929,337 B2
(45) Date of Patent: Feb. 23, 2021

(54) DISTRIBUTED ERROR AND ANOMALY COMMUNICATION ARCHITECTURE FOR ANALOG AND MIXED-SIGNAL SYSTEMS

(71) Applicant: Intel Corporation, Santa Clara, CA (US)

(72) Inventors: Rahul Kundu, San Jose, CA (US); Fei Su, Ann Arbor, MI (US); Prashant Goteti, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/422,714

(22) Filed: May 24, 2019

(65) Prior Publication Data
US 2019/0361839 A1 Nov. 28, 2019

(51) Int. Cl.
| | |
|---|---|
| *G06F 15/78* | (2006.01) |
| *G06F 30/34* | (2020.01) |
| *G06F 30/327* | (2020.01) |
| *G06F 11/34* | (2006.01) |
| *G06F 11/07* | (2006.01) |
| *G06F 11/30* | (2006.01) |

(52) U.S. Cl.
CPC ........ *G06F 15/7807* (2013.01); *G06F 30/327* (2020.01); *G06F 30/34* (2020.01); *G06F 11/0751* (2013.01); *G06F 11/3006* (2013.01); *G06F 11/3058* (2013.01); *G06F 11/3452* (2013.01)

(58) Field of Classification Search
CPC .... G06F 15/7807; G06F 30/327; G06F 30/34; G06F 11/3452; G06F 11/0751; G06F 11/3058; G06F 11/3006
See application file for complete search history.

(56) References Cited

U.S. PATENT DOCUMENTS

| | | | | |
|---|---|---|---|---|
| 6,386,052 | B1 * | 5/2002 | Satoh | B62D 5/049 73/1.09 |
| 8,266,506 | B2 * | 9/2012 | Hao | H03M 13/51 714/777 |
| 8,799,507 | B2 * | 8/2014 | Keen | H04L 45/748 709/238 |
| 9,413,783 | B1 * | 8/2016 | Keogh | H04L 63/1458 |
| 10,282,438 | B2 * | 5/2019 | McKenna | G06F 16/9014 |
| 10,318,484 | B2 * | 6/2019 | Finlay | G06F 16/1744 |

(Continued)

OTHER PUBLICATIONS

B. Bloom, "Space/Time Trade-offs in Hash Coding with Allowable Errors," Communications of the ACM, Jul. 1970, pp. 422-426, vol. 13: No. 7, Association for Computing Machinery (ACM), New York, NY.

(Continued)

*Primary Examiner* — Stacy Whitmore

(74) *Attorney, Agent, or Firm* — Jordan IP Law, LLC

(57) ABSTRACT

Methods, systems and apparatuses may provide for technology that detects, by a first monitor in a first domain of a system, a presence of a first anomaly in the first domain and encodes, by the first monitor, the presence of the first anomaly and a weight of the first anomaly into a multi-level data structure. In one example, the technology also sends, by the first monitor, the multi-level data structure to a second monitor in a second domain of the system, wherein the second domain is located at a different hierarchical level in the system than the first domain.

24 Claims, 18 Drawing Sheets

(56) References Cited

U.S. PATENT DOCUMENTS

| | | | | |
|---|---|---|---|---|
| 10,685,159 | B2* | 6/2020 | Su | G06N 5/04 |
| 2003/0085576 | A1* | 5/2003 | Kuang | B60W 10/08 |
| | | | | 290/40 C |
| 2010/0269024 | A1* | 10/2010 | Hao | H03M 13/13 |
| | | | | 714/777 |
| 2013/0246651 | A1* | 9/2013 | Keen | H04L 45/7453 |
| | | | | 709/238 |
| 2015/0172900 | A1* | 6/2015 | Pianese | H04L 41/12 |
| | | | | 370/254 |
| 2016/0359887 | A1* | 12/2016 | Yadav | H04L 61/1511 |
| 2017/0193136 | A1* | 7/2017 | Prasad | G06F 30/327 |
| 2018/0063084 | A1* | 3/2018 | Wakumoto | H04L 63/101 |
| 2019/0043341 | A1* | 2/2019 | Wouhaybi | G08B 7/066 |
| 2019/0044912 | A1* | 2/2019 | Yang | H04L 63/1425 |
| 2019/0050308 | A1* | 2/2019 | Chaudhari | G06F 11/2284 |
| 2019/0050515 | A1* | 2/2019 | Su | G06N 3/0445 |
| 2019/0190743 | A1* | 6/2019 | Vishnumolakala | |
| | | | | H04L 43/0876 |
| 2019/0280952 | A1* | 9/2019 | Sizer | H04L 43/065 |
| 2020/0036483 | A1* | 1/2020 | Aijaz | H04W 72/121 |

OTHER PUBLICATIONS

A. Broder et al., "Network Applications of Bloom Filters: A Survey," Internet Mathematics, May 10, 2004, pp. 485-509, vol. 1: No. 4.
L. Fan et al., "Summary Cache: a Scalable Wide-Area Web Cache Sharing Protocol," IEEE/ACM Transactions on Networking, Jun. 2000, 13 pages, vol. 8: No. 3, IEEE Press, Press Piscataway, NJ.
N. Farrington et al., "Facebook's Data Center Network Architecture," 2013 Optical Interconnects Conference, May 2013, 2 pages, Santa Fe, NM.
V. Geurkov, "A Concurrent Testing Technique for Analog-to-Digital Converters," 2011 IEEE 17th International Mixed-Signals, Sensors and Systems Test Workshop, 2011, 4 pages, Department of Electrical and Computer Engineering Ryerson University, Toronto, Ontario, Canada.
International Organization for Standarization (ISO), Road Vehicles Functional Safety Standards, 2016, ISO/DIS 26262-1, 752 pages, Second edition, Geneva, Switzerland.

H. Kopetz, "A Comparison of TTP/C and FlexRay," TU Wien Research Report Oct. 2001, May 9, 2001, 22 pages, Institut für Technische Informatik, Technische Universität Wien, Vienna, Austria.
B. Li et al., "A Case Study of Electromigration Reliability: From Design Point to System Operations," IEEE International Reliability Physics Symposium (IRPS), 6 pages, 2015, IBM Research, Yorktown Heights, NY.
Y. Li et al., "CASP: Concurrent Autonomous Chip Self-Test Using Stored Test Patterns," 2008 Design, Automation and Test in Europe, 2008, 6 pages.
Y. Makris et al., "Enhancing Reliability of RTL Controller-Datapath Circuits via Invariant-Based Concurrent Test," IEEE Transaction on Reliability, Jun. 28, 2004, 10 pages, vol. 53: Issue 2.
H. McMahan et al., "Federated Learning of Deep Networks using Model Averaging," Feb. 17, 2016, 11 pages, Google, Inc., Seattle, WA.
M. Nielsen, "Why Bloom filters work the way they do," <michaelnielsen.org/ddi/why-bloom-filters-work-the-way-they-do>, retrieved May 24, 2019, 12 pages.
A. Pagh et al., "An Optimal Bloom Filter Replacement," SODA '05 Proceedings of the sixteenth annual ACM-SIAM symposium on Discrete algorithms, 2005, 7 pages, Society for Industrial and Applied Mathematics, Philadelphia, PA.
A. Roy et al., "Passive Realtime Datacenter Fault Detection and Localization," 14th USENIX Symposium on Networked Systems Design and Implementation, 2017, vol. 42: No. 3, Boston, MA.
J. Rushby, "A Comparison of Bus Architectures for Safety-Critical Embedded Systems," CSL Technical Report, Jun. 2002, 59 pages, Computer Science Laboratory SRI International, Menlo Park, CA.
H. Song et al., "IPv6 Lookups using Distributed and Load Balanced Bloom Filters for 100Gbps Core Router Line Cards," IEEE Infocom 2009 proceedings, 2009, 9 pages, Bell Labs, Alcatel-Lucent, Holmdel, NJ.
F. Su et al., "Improving Analog Functional Safety Using Data-Drive Anomaly Detection," International Test Conference, 2018, 10 pages, Paper 13.3, Intel Corporation.
T. Uemura et al.,"Investigation of Logic Circuit Soft Error Rate (SER) in 14nm FinFET Technology," IEEE International Reliability Physics Symposium (IRPS), 4 pages, 2016.
X. Xuan et al., "Sensitivity and Reliability Evaluation for Mixed-Signal ICs under Electromigration and Hot-Carrier Effects," IEEE International Symposium on Defect and Fault Tolerance in VLSI Systems, 6 pages, 2001, School of Electrical and Computer Engineering Georgia Institute of Technology, Atlanta, GA.

* cited by examiner

147

DISTRIBUTED ERROR AND ANOMALY COMMUNICATION ARCHITECTURE FOR ANALOG AND MIXED-SIGNAL SYSTEMS

TECHNICAL FIELD

Embodiments generally relate to error prediction. More particularly, embodiments relate to a distributed error and anomaly communication architecture for analog and mixed-signal systems, devices and/or platforms.

BACKGROUND

Due to the proliferation of various applications such as, for example, distributed database control, autonomous driving, etc., robust systems have gained importance in recent years. With the scaling of device and interconnect sizes, supply voltages and node capacitances, the sensitivity to both external disturbances (e.g., "soft errors") and internal disturbances (e.g., electro-migration, "hot carrier" effects) is increasing. As a result, traditional in-field testing only before or after device operation may not be sufficient, particularly if the application is mission critical in nature. For example, many of the disturbances may cause the device to fail only under specific operating conditions. Moreover, concurrent testing (e.g., testing while the device is in operation) of analog and mixed-signal blocks may be challenging because although any disturbance in parameters of a mixed-signal system may cause excursions from the nominal operating point, the parameter disturbances may not always result in a faulty operation. While attempts may have been made to determine if a mixed-signal system is entering into a faulty state by detecting anomalies and early warning signs, there remains considerable room for improvement. For example, conventional solutions may collect anomalies from only a limited region of the system. Observing anomaly signals from a limited region may result in relatively low confidence in the overall state of the system.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
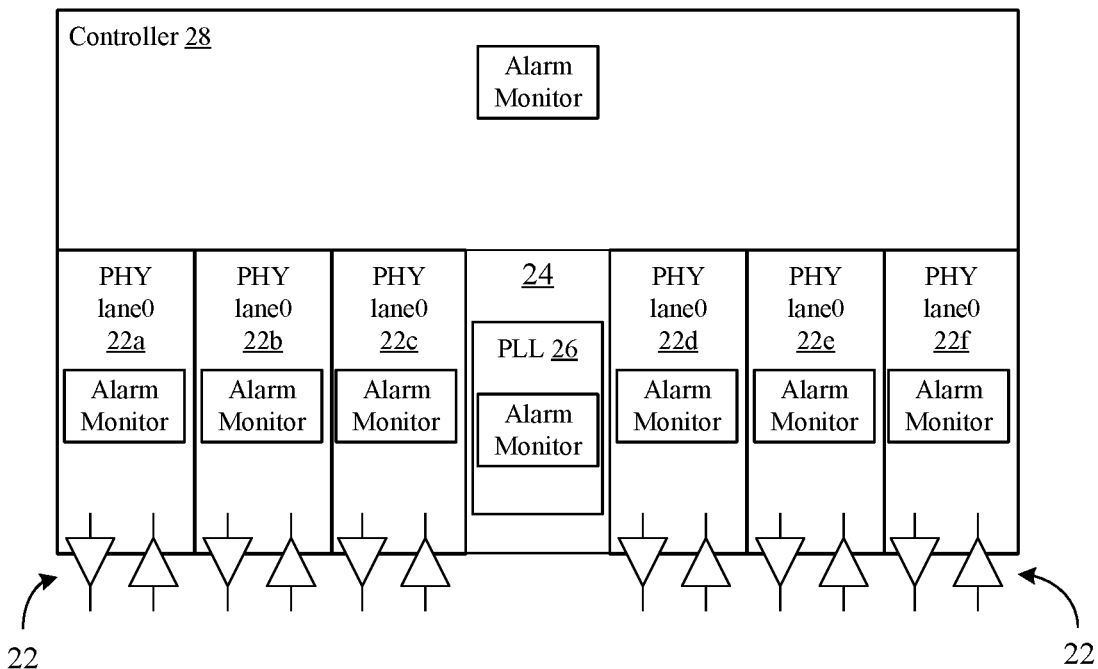
FIG. 1 is a schematic diagram of an example of a mixed-signal system according to an embodiment.

FIG. 1 shows a mixed-signal system 20 in which a high-speed serial input/output (IO) interface includes a plurality of physical layer (PHY) lanes 22 (22a-22f) and a common lane 24. In the illustrated example, each of the PHY lanes 22 includes a transmitter and receiver and the common lane 24 includes a phase locked loop (PLL) 26 that generates a clock to be used when exchanging data between a controller 28 (e.g., at a data link layer) and other components (not shown). In an embodiment, the PHY lanes 22 and the common lane 24 are considered to reside in a first domain of the system 20 and the controller 28 is considered to reside in a second domain of the system 20, wherein the second domain is located at a different hierarchical level in the system 20 than the first domain. Additionally, each of the controller 28, the PHY lanes 22, and the PLL 26 may include an alarm monitor (e.g., anomaly collector) to detect anomalies and communicate the anomalies and their respective weights to the other components of the system 20.

For example, the alarm monitor within the PLL 26 might detect an anomaly in one or more bias values of the PLL 26, wherein the bias value anomalies alone may not provide enough information to conclude that the PLL 26 is operating erroneously and needs restart. If, however, the alarm monitoring block in more than one of the PHY lanes 22 indicates a smaller "eye" (e.g., associated with an increase in timing jitter), then a higher confidence exists that the excursion in the parameters detected in the PLL 26 may be an actual error that warrants corrective action. Similarly, if the alarm monitor of the controller 28 indicates that there are a relatively high number of re-tries at the data link layer, then the confidence that there is an early warning sign of an error may be even greater. Thus, having access to all of the anomaly data at the various hierarchy levels increases the confidence of the conclusion and enables spurious false alarms to be ruled out.

Another example of the value of having the illustrated hierarchical anomaly detection scheme is the ability to achieve "federated learning". Consider, for example, N number of cars on a highway communicating through a cloud computing infrastructure (e.g., cloud). Let us assume that one vehicle observes higher slippage in the tires of the vehicle and no determination can be made whether the slippage is an error (e.g., and whether action needs to be taken to prevent a catastrophic failure). If, however, alarm collectors from other vehicles on the same road raise similar alarms and this information is communicated through the cloud to all of the vehicles, then, once the information is received, vehicles on that road can tune their respective stability control procedures to achieve greater safety and/or performance.

As will be discussed in greater detail, the alarm communication infrastructure described herein may include a multi-level data structure referred to as a weighted anomaly collector (WAC), which is used by the various blocks of the system 20 to exchange and store alarm/anomaly information with each other in an efficient way. This information exchange is based on an enhancement to a traditional bloom filter to store not only the set membership information for every alarm, but also limited data/weight for each alarm. Additionally, the data may be exchanged in a lossless manner (albeit with some aliasing probability) across hierarchies by combining WACs from sub-hierarchies. Moreover, the underlying communication architecture is robust and enables subsystems to communicate with each other dynamically.

Figure 2A:
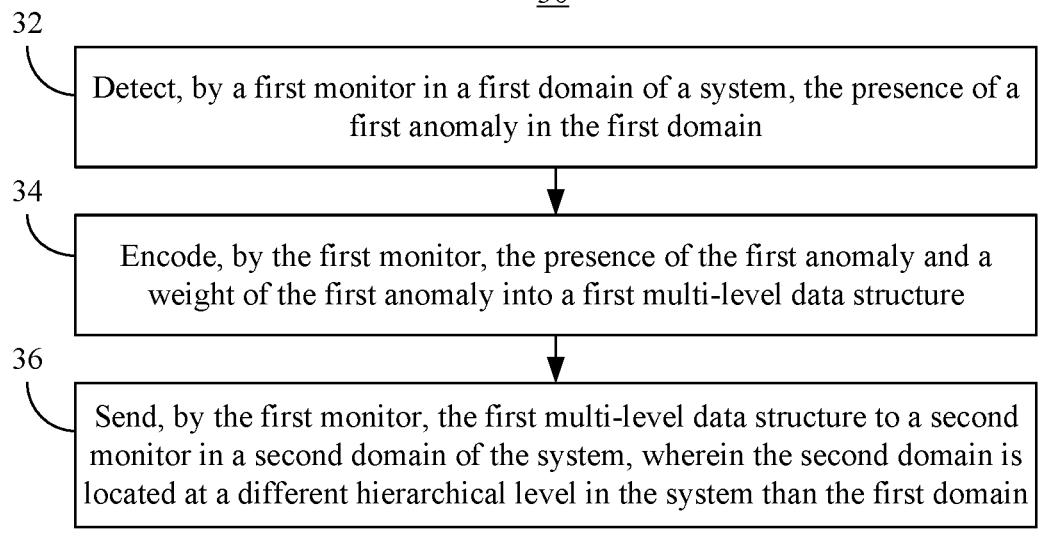
FIGS. 2A and 2B are flowcharts of examples of methods of operating a first monitor in a first domain of a system according to an embodiment.

FIG. 2A shows a method 30 of operating a first monitor in a first domain. The method 30 may generally be implemented in an alarm monitor such as, for example, any of the alarm monitors in the system 20 (FIG. 1), already discussed. More particularly, the method 30 may be implemented as one or more modules in a set of logic instructions (e.g., software) stored in a non-transitory machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality hardware logic using circuit technology such as, for example, application specific integrated circuit (ASIC), complementary metal oxide semiconductor (CMOS) or transistor-transistor logic (TTL) technology, or any combination thereof.

For example, computer program code to carry out operations shown in the method 30 may be written in any combination of one or more programming languages, including an object oriented programming language such as JAVA, SMALLTALK, C++ or the like and conventional procedural programming languages, such as the "C" programming language or similar programming languages. Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Illustrated processing block 32 provides for detecting, by a first monitor in a first domain of a system, the presence of a first anomaly in the first domain. Additionally, block 34 encodes, by the first monitor, the presence of the first anomaly and a weight of the first anomaly into a first multi-level data structure (e.g., WAC). As will be discussed in greater detail, block 34 may include hashing the first anomaly into a plurality of locations in a multi-level bloom filter and incrementing counters at the plurality of locations in the multi-level bloom filter. Block 36 sends, by the first monitor, the first multi-level data structure to a second monitor in a second domain of the system, wherein the second domain is located at a different hierarchical level in the system than the first domain. The illustrated method 30 therefore increases the confidence in error predictions based on anomaly information that is collected and shared across multiple hierarchical levels in a system. While the example of two hierarchical levels is described in the method 30, the number of levels may be greater than two depending on the circumstances.

Figure 3:
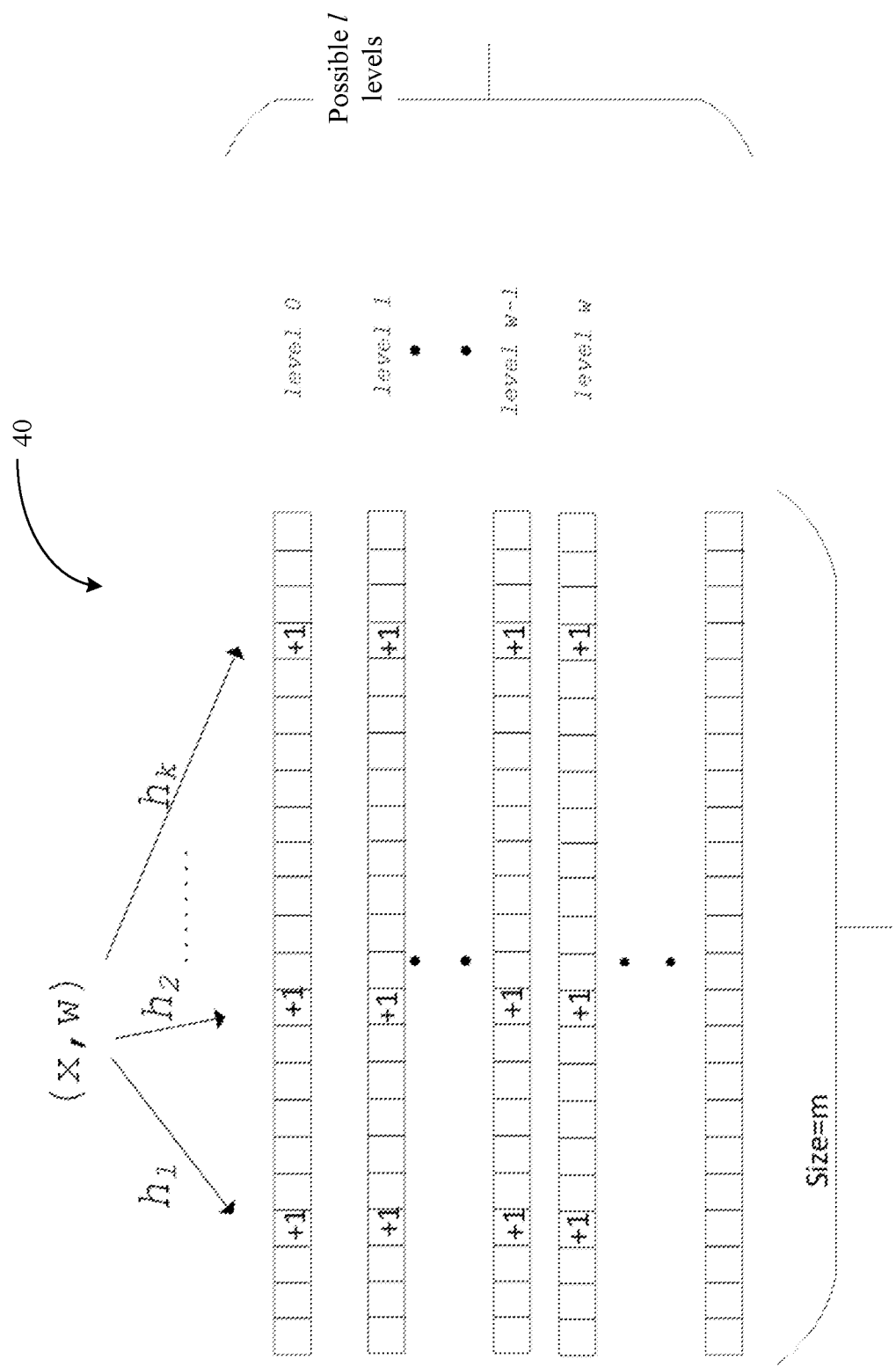
FIG. 3 is an illustration of an example of a multi-level data structure according to an embodiment.

Turning now to FIG. 3, a multi-level data structure such as, for example, a WAC 40 is shown, wherein the WAC 40 is an enhancement to the standard bloom filter that is used to encode/represent anomaly information along with the weight of each anomaly. The standard bloom filter is a well-known data structure that may have been used in big data storage, Internet routing protocols and other applications. The main utility of the bloom filter is that it allows the storage of set membership data spanning a large number of objects with a relatively small number of bits. The standard bloom filter has relatively low aliasing probability if the number of members being stored at any given point of time is not very large. Additionally, the chance of negative aliasing is zero (e.g., the filter never falsely indicates that a member is not present). There is, however, a small, tunable probability of the filter falsely indicating that a member is present. These two properties make the bloom filter very suitable to represent alarm information because a) the set of possible alarms is relatively large, but at a given moment in time only a handful of alarms will be active, and b) the alarm representation is "pessimistic" (e.g., it never misses alarms, but may over-signal alarms with a small probability).

In the traditional bloom filter, an object (e.g., anomaly) x is applied to k hash functions ($h_1$, $h_2$ ... $h_k$), each of which sets one bit in the bloom filter. If the bloom filter size is m and the number of elements stored at any one time is n, then the probability of aliasing is given by $$\left(1 - e^{\frac{-kn}{m}}\right)^k.$$

Since the original bloom filter supports only insertion, a modified counting bloom filter may be used to support the deletion of elements/anomalies. One advantage of using bloom filter based solutions described herein is that it may be efficient to realize in hardware because the hash functions can be parallelized with a constant look up time. In another embodiment, however, the bloom filter is realized in software. In the architecture described herein, higher hierarchies (e.g., cloud) might implement the multi-level data structure in software, which may provide configurability at the cost of speed (e.g., where lower speed may exist at higher levels anyway). Another advantage is in terms of storage efficiency, where it has been shown that bloom filters are close to the theoretical lower limit.

Along with the alarm presence/absence information, the illustrated WAC 40 is expanded beyond the capability of a standard bloom filter to provide the ability to send some minimally coded information (e.g., a value of 0, 1, 2 ... ) with every alarm. More particularly, the illustrated WAC 40 is a data structure that is composed of l levels of bloom filters numbered 0 ... l–1. Thus, the illustrated WAC 40 takes the input, an object x and a weight=w to store and encodes a value in up to w levels at all of the hash positions. Additionally, to support deletion, every bit is replaced by a small counter (e.g., "+1," typically counting up to three or four is enough). Accordingly, every time a new object is added, if the object hashes to 1 at a particular location and level, instead of encoding a "1" there, the count of that location and level is incremented by 1. Similarly, every time an object that hashes to that location is removed, the count of that location and level is decremented by 1.

Thus, to store an object x with weight=w, it may be assumed that x hashes to locations $h_1$, $h_2$, ... $h_k$. If w=0, the count corresponding to the locations $h_1$, $h_2$, ... $h_k$ is incremented in only the $0^{th}$ level bloom filter. If w=1, then the count at locations $h_1, h_2, \ldots h_k$ is incremented in both the bloom filters of level 0 and level 1. Generalized for any level w, the counts for locations $h_1, h_2, \ldots h_k$ will be incremented by 1 in all of the bloom filters from level 0 up to w.

As will be discussed in greater detail, the aliasing probability of the WAC 40 with size=m and l levels is the same as the aliasing probability of a standard bloom filter with one level and m·l (m multiplied by l) slots, provided that the probability distribution of the weights is equally distributed among levels 0 ... l–1. If, instead of having m slots in a single level bloom filter, the filter is split up into the WAC 40 having l layers of bloom filters with each layer having $$\frac{m}{l}$$

slots (as shown), the aliasing probability is not compromised, but adds the advantage that the WAC 40 can represent weights from 0 ... l–1, along with set membership. Thus, introducing weights (e.g., by using levels) does not compromise the aliasing probability or the storage requirements. Hence, the WAC 40 may be used to represent alarm-weight pairs without any extra storage penalty over what is needed to store only alarms in a standard bloom filter.

Figure 2B:
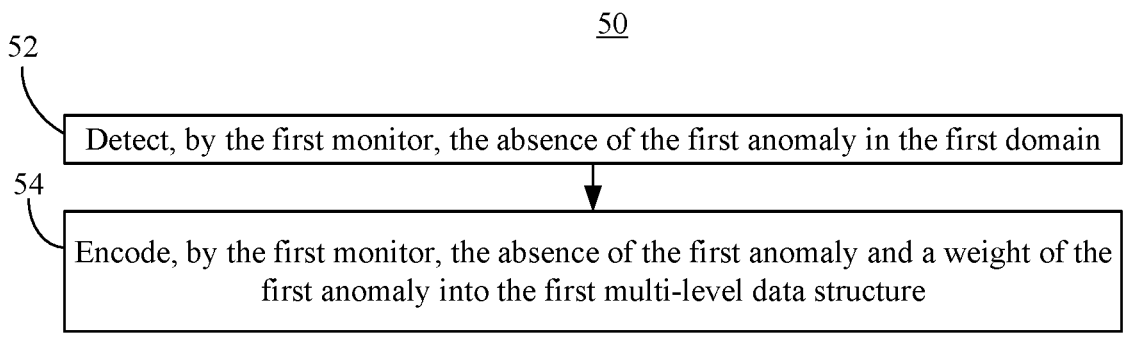

FIG. 2B shows a method 50 of operating a first monitor in a first domain. The method 50 may generally be implemented in an alarm monitor such as, for example, any of the alarm monitors in the system 20 (FIG. 1), already discussed. More particularly, the method 50 may be implemented as one or more modules in a set of logic instructions stored in a non-transitory machine- or computer-readable storage medium such as RAM, ROM, PROM, firmware, flash memory, etc., in configurable logic such as, for example, PLAs, FPGAs, CPLDs, in fixed-functionality hardware logic using circuit technology such as, for example, ASIC, CMOS or TTL technology, or any combination thereof.

Illustrated processing block 52 provides for detecting, by the first monitor, an absence of a first anomaly in the first domain. In an embodiment, block 54 encodes, by the first monitor, the absence of the first anomaly and the weight of the first anomaly into a first multi-level data structure such as, for example, the WAC 40 (FIG. 3). In one example, block 54 includes hashing the first anomaly into a plurality of locations in a multi-level bloom filter and decrementing counters at the plurality of locations in the multi-level bloom filter. The method 50 may therefore further enhance performance by supporting the deletion of anomalies.

Figure 4:
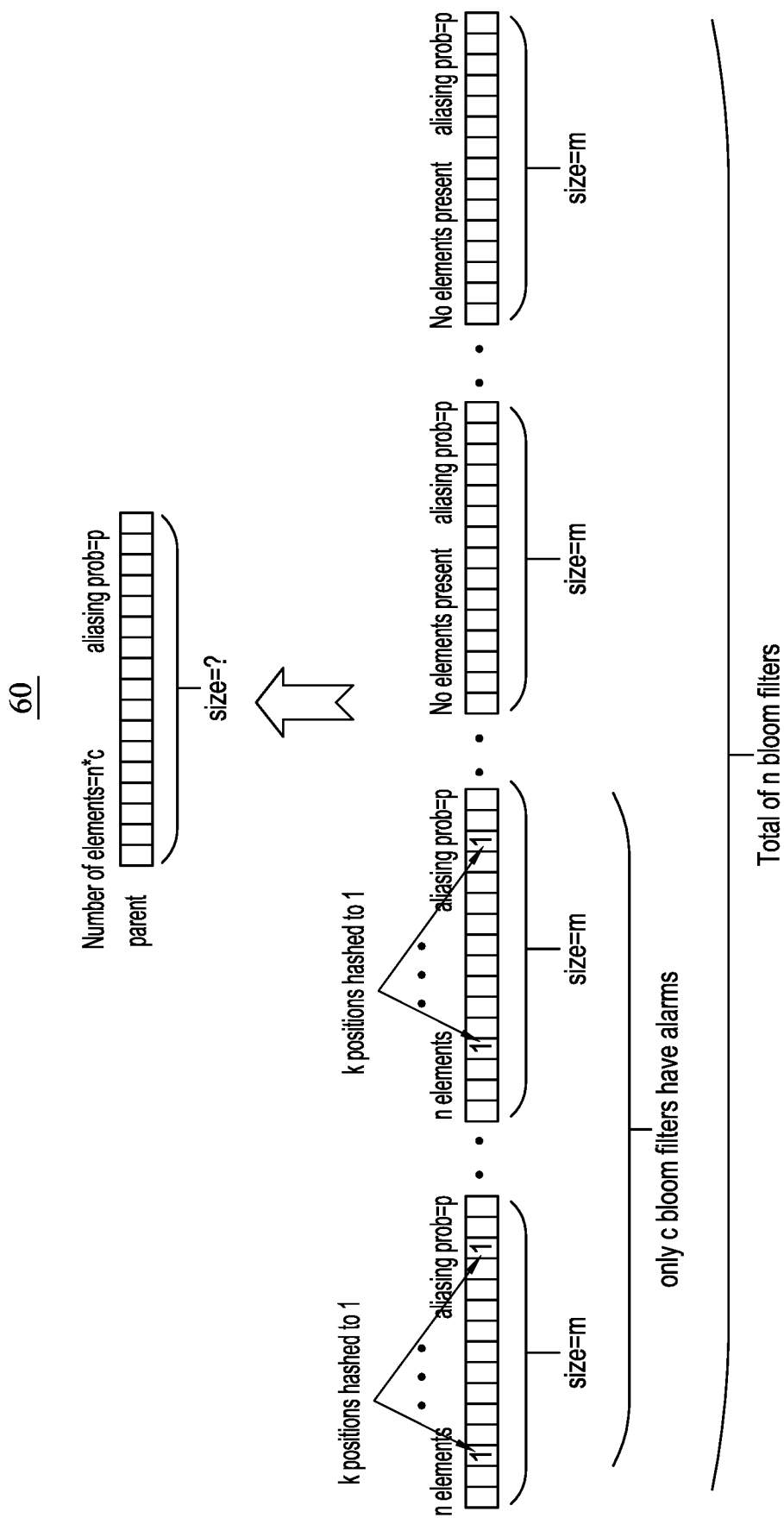
FIG. 4 is an illustration of an example of a hierarchical plurality of data structures according to an embodiment.

FIG. 4 shows a hierarchical plurality of data structures 60. For ease of explanation, the combining of WACs from child hierarchies will be described with respect to standard bloom filters, followed by an explanation of how the same combining approach may be extended to WACs. In the illustrated example, a collection of N lower level hierarchies each send out alarm information in a lossless manner, coded in the form of bloom filters. If each bloom filter has the size m, up to n number of elements, and an aliasing probability p, all of the combined information may be stored in one bloom filter in the parent with the same aliasing probability p as each of the children.

A brute force method of combining the child bloom filters might be to simply append each child bloom filter to the parent bloom filter, which would preserve the aliasing probability p. In that case, however, the length of the parent filter would be N·m. This result may be unacceptable in many cases where the number of children may be very large. For example, if federated learning is being enabled across all vehicles in a highway or all workstations in a datacenter, N may be greater than 100 or 1000 and the size of the parent bloom filter may be unacceptably large. Instead, the fact that typically at one time, not all children will simultaneously have alarms may be leveraged to obtain an enhanced result. From statistical studies on typical data, a number c may be designated, so that at any instant, typically only c children will have alarms. Accordingly, the parent bloom filter size may be dependent only on the number of typical alarms present in the children (e.g., at any individual time instant).

Therefore, the approach to combining bloom filters may be as follows. Each bit in the child bloom filters is treated as an object by itself that is going to be hashed into the parent bloom filter. Additionally, each child bloom filter may be assumed to have k hash functions. In such a case, the number of bits in each child bloom filter is k·n (e.g., where n=actual number of objects present in each child bloom filter). Assuming that at a time, on an average, c of the child bloom filter have alarms, the total number of objects that are to be hashed by the parent bloom filter is k·n·c. Accordingly, maximum size of the parent bloom filter is $$k.n.c. \left( 1.44 \log_2 \frac{1}{p} \right).$$

Moreover, if each of the child bloom filters are optimally designed, then the relationship between the size of each child bloom filter and the number of elements in each child is $$m = \left( 1.44 \log_2 \frac{1}{p} \right) \cdot n.$$

So, as long as k·c<<N, (which is expected, if N is large) the size of the parent bloom filter is much less than what it would have been if the brute force approach had been followed (which yielded N·m). The illustrated solution therefore enables the size of the parent bloom filter to be contained when combining the child bloom filters.

To determine the existence of an object/alarm in the child, the parent alarm monitor may perform a two-level query. It first determines which bits are to be set in the child filter ($b_0$, $b_1$, $b_i$ ... $b_k$). Then for each of these bits the parent alarm monitor queries the parent filter to determine which set of bits are to be set in the parent filter for each bit $b_i$. The parent alarm monitor then checks the parent filter to determine whether those bits are actually set. This approach may be generalized to any number of levels. The aliasing probability of this two level lookup is equal to the aliasing probability in the child bloom filter+aliasing probability in the parent bloom filter=p·(number of hierarchies spanned). Thus, the total aliasing probability grows linearly rather than exponentially as more hierarchies are included.

The same combining mechanism may be extended to WACs such as, for example, the WAC 40 (FIG. 3). The only difference is that, while each entry in a standard child bloom filter is a bit, each entry in a child WAC is a bit along with a weight from (0 ... l–1), which can be mapped to the parent WAC with the same weight range (0 ... l–1) similarly to any object with a weight that is mapped to a WAC.

Figure 2C:
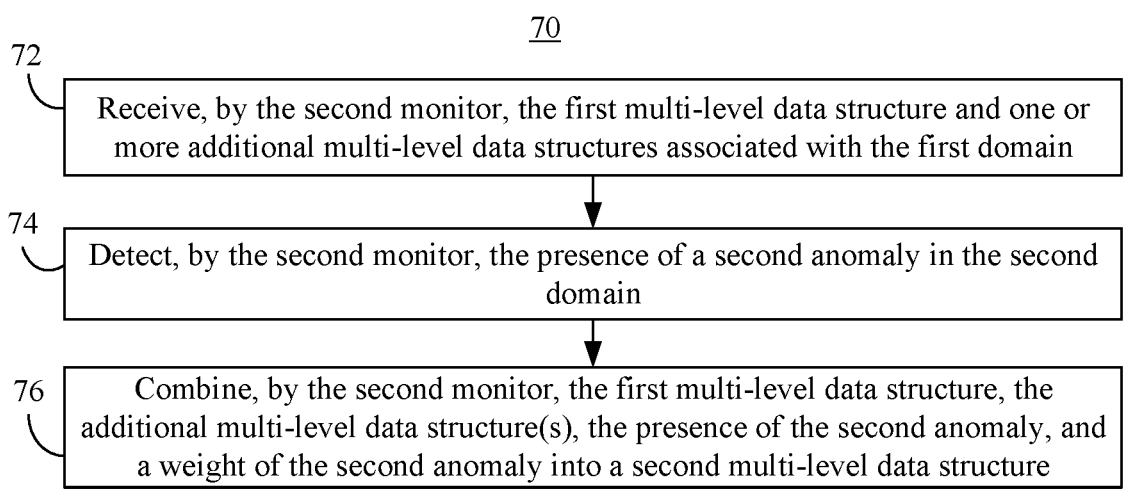
FIGS. 2C and 2D are flowcharts of examples of methods of operating a second monitor in a second domain of a system according to an embodiment.

FIG. 2C shows a method 70 of operating a second monitor in a second (e.g., parent) domain of a system. The method 70 may generally be implemented in an alarm monitor such as, for example, any of the alarm monitors in the system 20 (FIG. 1), already discussed. More particularly, the method 70 may be implemented as one or more modules in a set of logic instructions stored in a non-transitory machine- or computer-readable storage medium such as RAM, ROM, PROM, firmware, flash memory, etc., in configurable logic such as, for example, PLAs, FPGAs, CPLDs, in fixed-functionality hardware logic using circuit technology such as, for example, ASIC, CMOS or TTL technology, or any combination thereof.

Illustrated processing block 72 provides for receiving, by the second monitor, a first multi-level data structure and one or more additional multi-level data structures associated with a first (e.g., child) domain. Block 74 detects, by the second monitor, the presence of a second anomaly in the second domain. In an embodiment, block 76 combines, by the second monitor, the first multi-level data structure, the additional multi-level data structure(s), the presence of the second anomaly, and a weight of the second anomaly into a second multi-level data structure. As already noted, the illustrated method 70 prevents the size of the second multi-level data structure from being relatively large. Accordingly, further enhanced performance and/or scalability may be achieved.

Figure 2D:
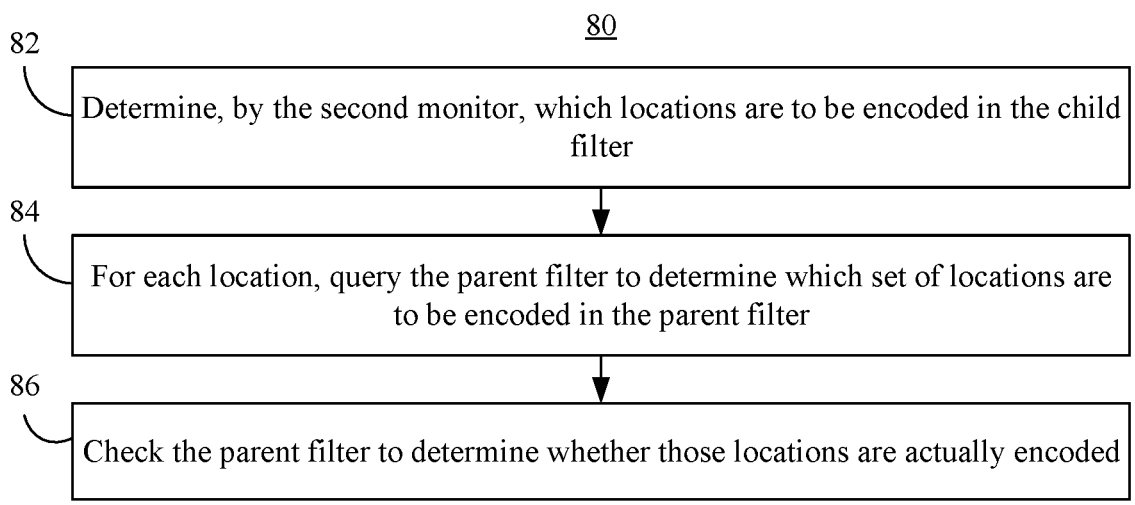

FIG. 2D shows another method 80 of operating a second monitor in a second domain of a system to combine multi-level data structures. The method 80 may generally be substituted for block 76 (FIG. 2C), already discussed. More particularly, the method 80 may be implemented as one or more modules in a set of logic instructions stored in a non-transitory machine- or computer-readable storage medium such as RAM, ROM, PROM, firmware, flash memory, etc., in configurable logic such as, for example, PLAs, FPGAs, CPLDs, in fixed-functionality hardware logic using circuit technology such as, for example, ASIC, CMOS or TTL technology, or any combination thereof.

Illustrated processing block 82 determines, by the second monitor, which locations are to be encoded (e.g., incremented or decremented) in a child filter (e.g., multi-level data structure associated with the child domain). For each location, illustrated block 84 queries the parent filter (e.g., multi-level data structure associated with the parent domain) to determine which set of locations are to be encoded in the parent filter. In an embodiment, block 86 checks the parent filter to determine whether those locations are actually encoded. The illustrated method 80 therefore enables data to be transmitted in a lossless manner through hierarchies using WACs.

Figure 5:
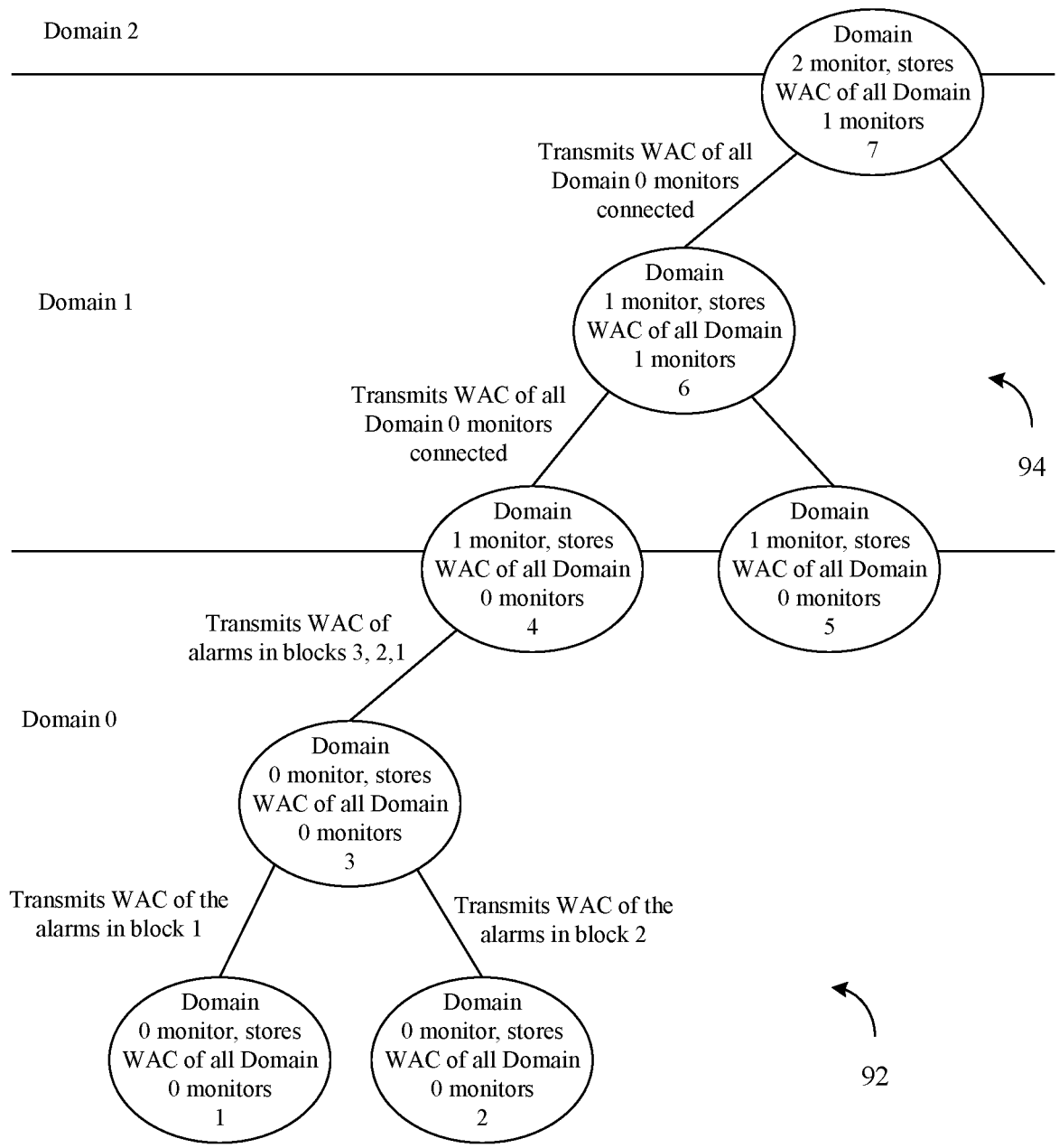
FIG. 5 is an illustration of an example of a plurality of domains according to an embodiment.

FIG. 5 shows a plurality of domains 90 including a number of blocks, each having an alarm monitor/collector. The alarm monitors communicate with one another, by transmitting composite alarm-weight information coded into the WAC format.

At the lowest hierarchy, there is a collection of basic alarm collectors called domain 0 alarm monitors 92, which are implemented at each lowest block (typically at the "IP" level). Above the domain 0 alarm monitors are the domain 1 alarm monitors 94, which communicate among themselves. Each of the domain 1 alarm monitors 94 represent information from the network of the domain 0 alarm monitors 92. Similarly, above the domain 1 alarm monitors 94 are domain 2 alarm monitors, which communicate among themselves, wherein each of them represent information from the network of domain 1 alarm monitors 94. The information flow proceeds similarly upwards in the illustrated hierarchy. For example, the domain 0 alarm monitors 92 ("1", "2", "3") communicate among themselves and with domain 1 alarm monitor "4" that represents all of them in the domain 1 network. In the domain 1 network, alarm monitors 94 ("4", "5", "6") communicate among themselves and with domain 2 alarm monitor "7" that represents them in the domain 2 network. Within each domain, the different alarm monitors can be arranged either in a hierarchical or in a shared bus architecture.

Based on practical considerations, several requirements are met. For example, with regard to robustness against link breakage, if any alarm collector or associated link fails, that failure neither causes a failure in the communication network nor affects other alarm collectors. Additionally, with regard to different levels of software and speed, it is assumed that the alarm collectors use the existing communication links that are present between blocks. The illustrated architecture is amenable to the fact that as information moves up the hierarchies, the protocols may increase in complexity and rely more on software. Moreover, with regard to security considerations and packet containment, at certain levels of hierarchies, there may be security barriers. Accordingly, in an embodiment, the lower hierarchies do not reveal implementation details to the upper hierarchies. Also, the alarm packets from each node do not propagate beyond the immediate subnetwork, in order to avoid packet flooding throughout the network. With regard to re-configurability, the network accommodates the various alarm collectors participating in the network joining and leaving any time.

Figure 6:
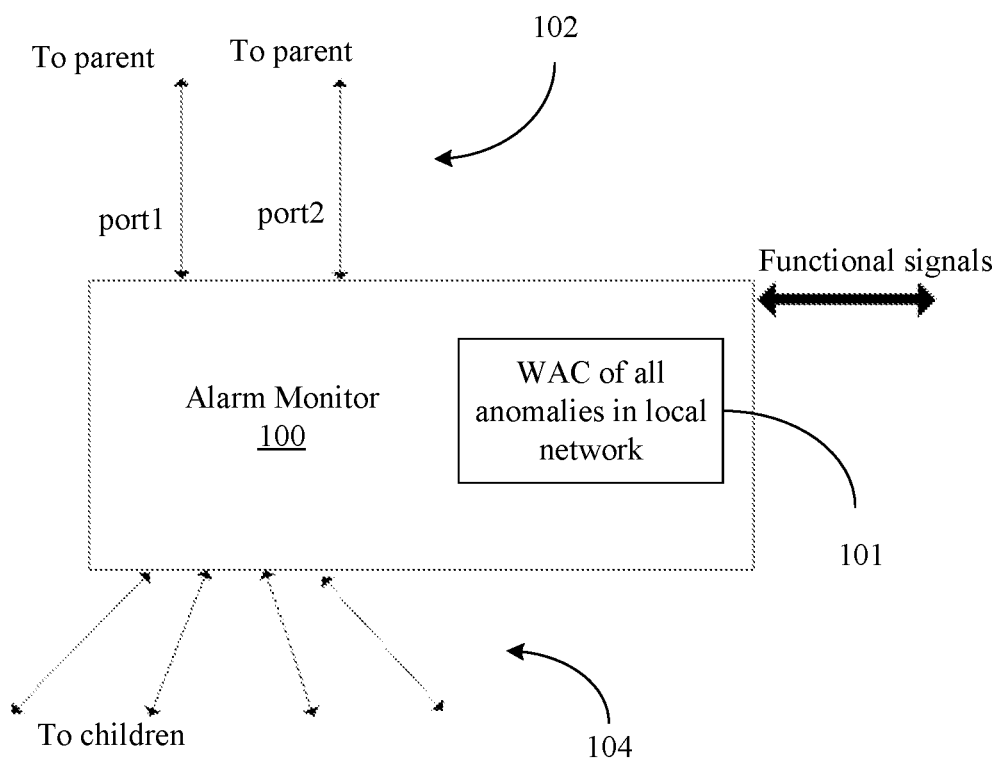
FIG. 6 is a block diagram of an example of an alarm monitor having redundant ports according to an embodiment.

FIG. 6 shows an alarm monitor 100 that may be readily substituted for any of the alarm monitors 92, 94 (FIG. 5), already discussed. In an embodiment, the alarm collector 100 collects alarms from the local level and creates a WAC 101 that encodes all of the anomalies/alarms present, along with their respective severity levels. The alarm collector 100 may send the WAC 101 along with an identifier (ID) of the alarm collector (e.g., serving the purpose of "unique-ification") and timestamp information. The WAC is sent as an alarm packet first to both parents of the alarm collector 100 and then to the children of the alarm collector 100. The parent, in turn, will first send the WAC to the parents of the parent if the parents are in the same domain of the originating alarm collector 100 and then send the WAC to its children (e.g., if the children are within the same domain). Such an approach ensures that within the same domain, all alarm monitors can share information about their respective alarms. Whenever interacting with the next domain in the network, each alarm monitor may send out an encoded WAC that contains information about all alarm monitors connected to it in that domain.

With continuing reference to FIGS. 5 and 6, the alarm monitor "4," is at the boundary of domain 0 and domain 1 and sends out the encoded WAC of all domain 0 alarm monitors as a single packet to domain 1. Thus, all domain 1 alarm monitors 94 are provided the WAC representation of all alarm monitors 92 in domain 0. Each alarm monitor 94 in domain 1 has its own internal WAC. Within those WACs, the domain 1 alarm monitors 94 merge the WACs that get transmitted to them and contain a compact representation of all domain 0 alarm monitors 92 and store the WACs. Similarly alarm monitor "7," which sits at the boundary of domain 1 and domain 2, will have an internal WAC that merges all of the domain 1 WACs. The illustrated alarm monitor "7" will transmit this WAC as a single packet to the networks in domain 2.

When a higher domain alarm monitor observes multiple of its children having similar type of alarms, the alarm monitor is free to increase the weight of those alarms when it communicates with its parents. For example, if a PHY controller observes that all of the different lanes under it are having alarms of the same kind with weight=2, the PHY controller may increase the weight of those alarms to 3 and communicate the increased weight backwards to its children (e.g., the individual PHY blocks from where the alarms originated).

The illustrated alarm monitor 100 contains two ports 102 to the two parents of the alarm monitor 100 and any number of ports 104 from the children of the alarm monitor 100. The alarm monitor 100 may also collect alarm information from the local block of the alarm monitor 100 and add the local alarm information to the alarm pool. In an embodiment, the alarm monitor 100 has an identical duplicate twin with a different ID that collects the same information and transmits to the same sets of parents and is located in a physically different location of the block/region so that it is not susceptible to the same errors.

Figure 7:
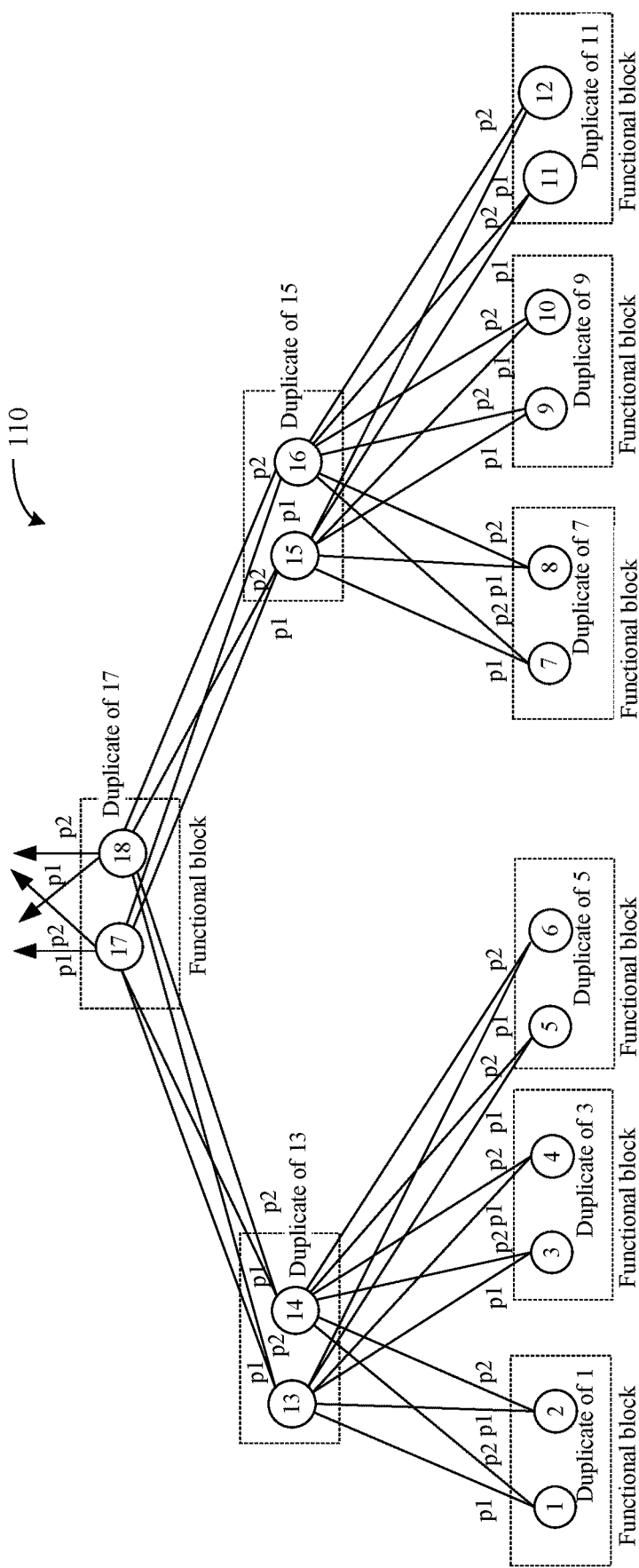
FIG. 7 is an illustration of an example of a hierarchical plurality of redundant alarm collectors having redundant ports according to an embodiment.
Figure 8A:
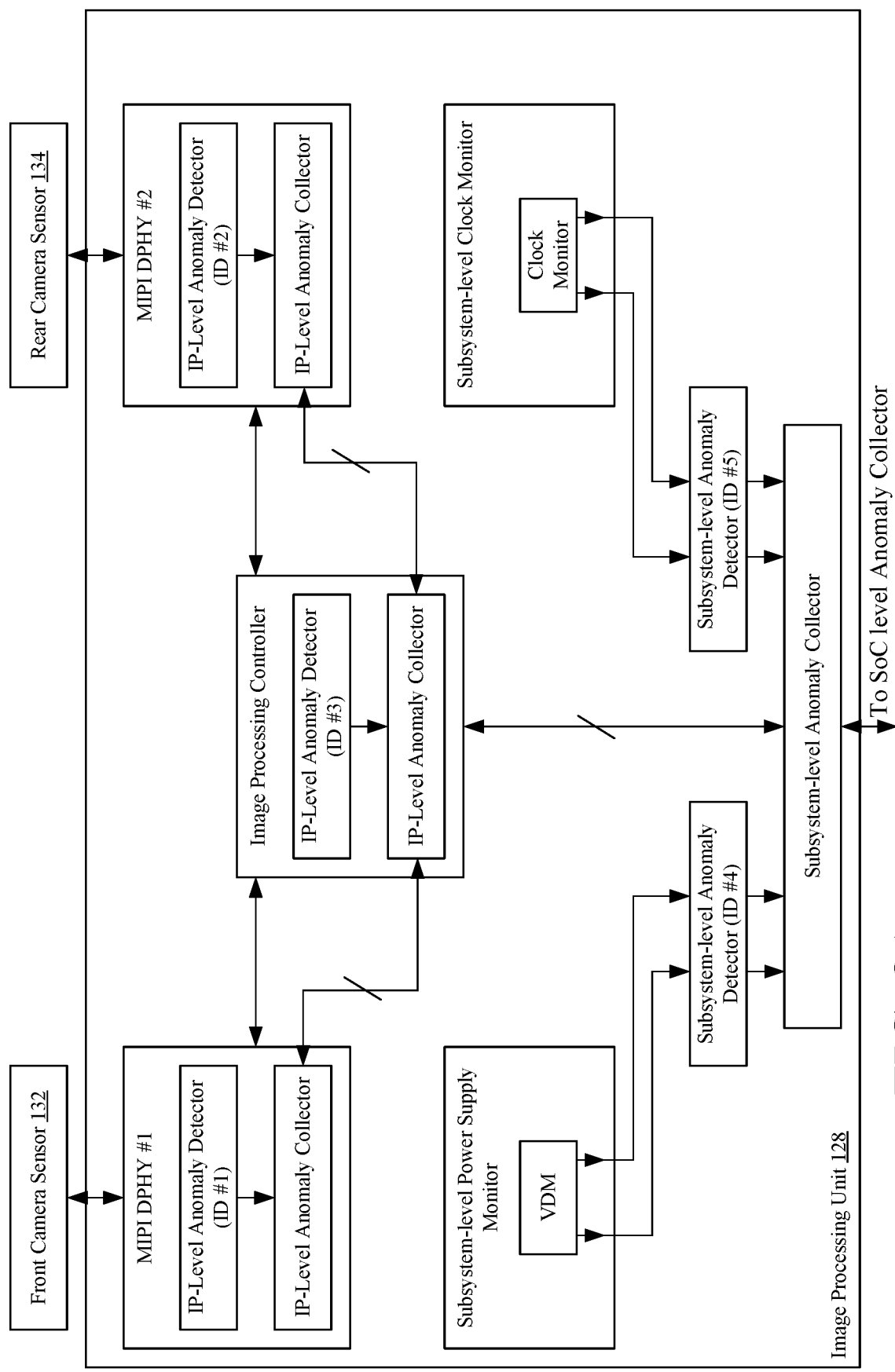
FIGS. 8A-8F are block diagrams of an example of the components of an automotive system on chip (SoC) according to an embodiment.
Figure 8B:
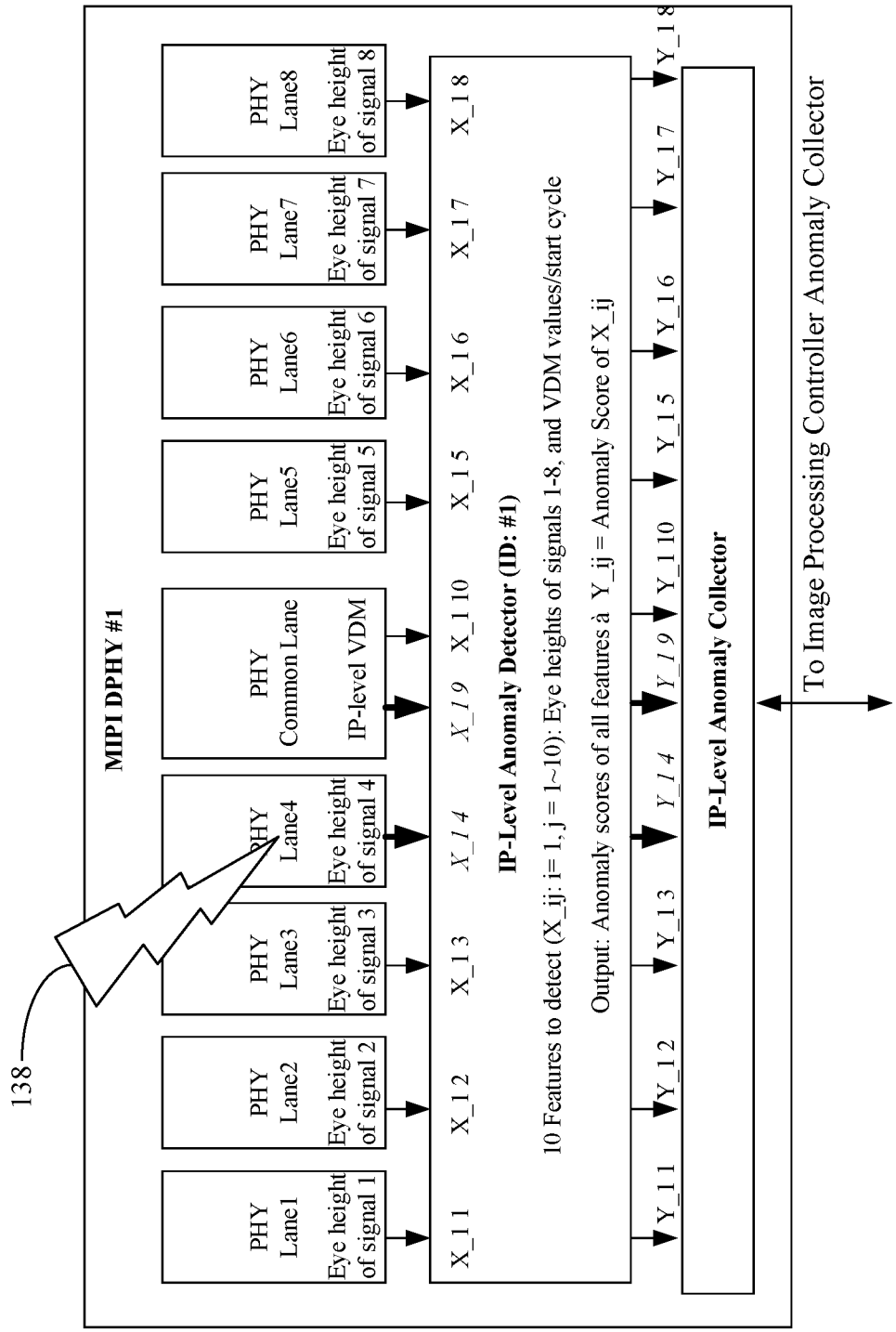
Figure 8C:
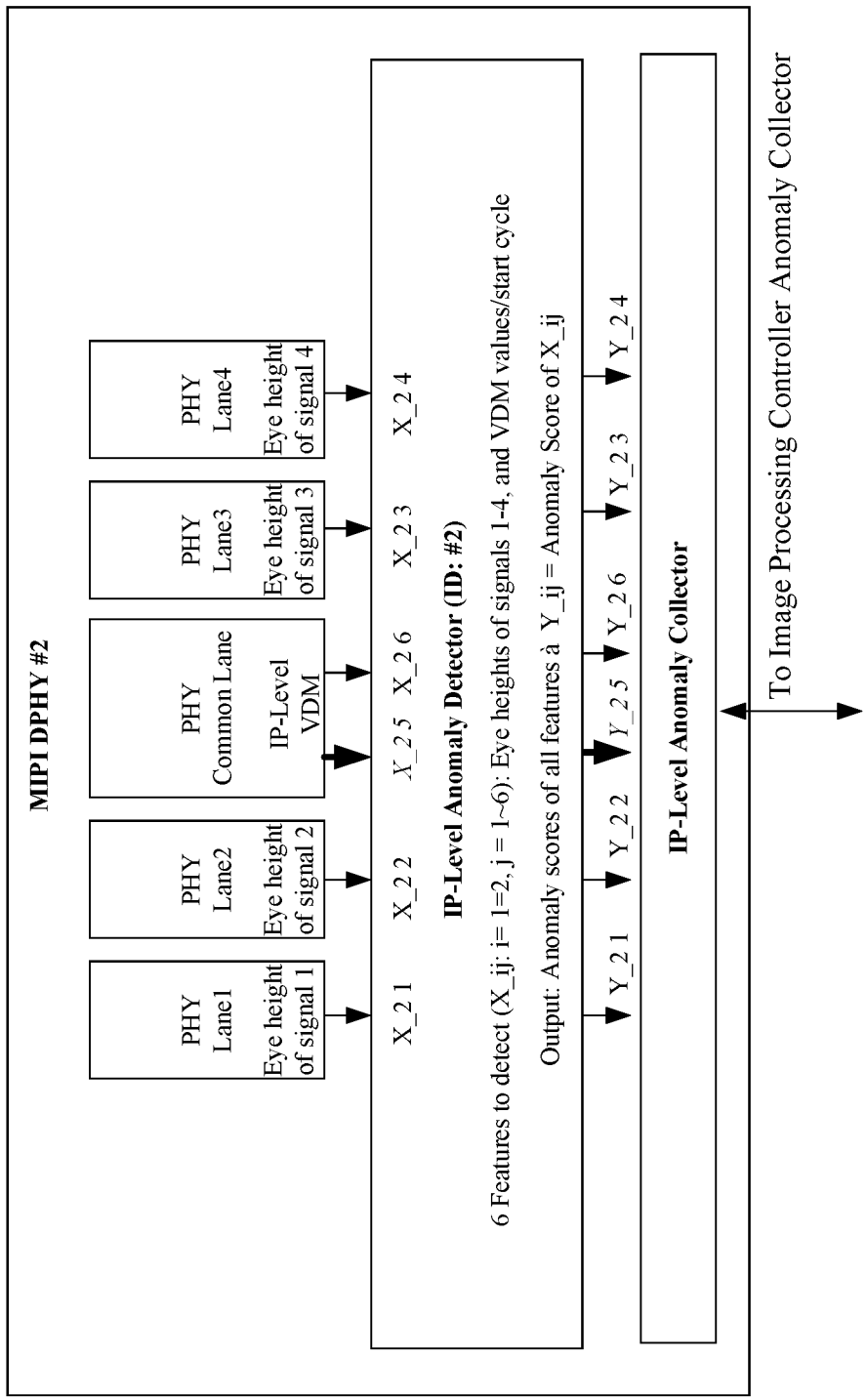
Figure 8D:
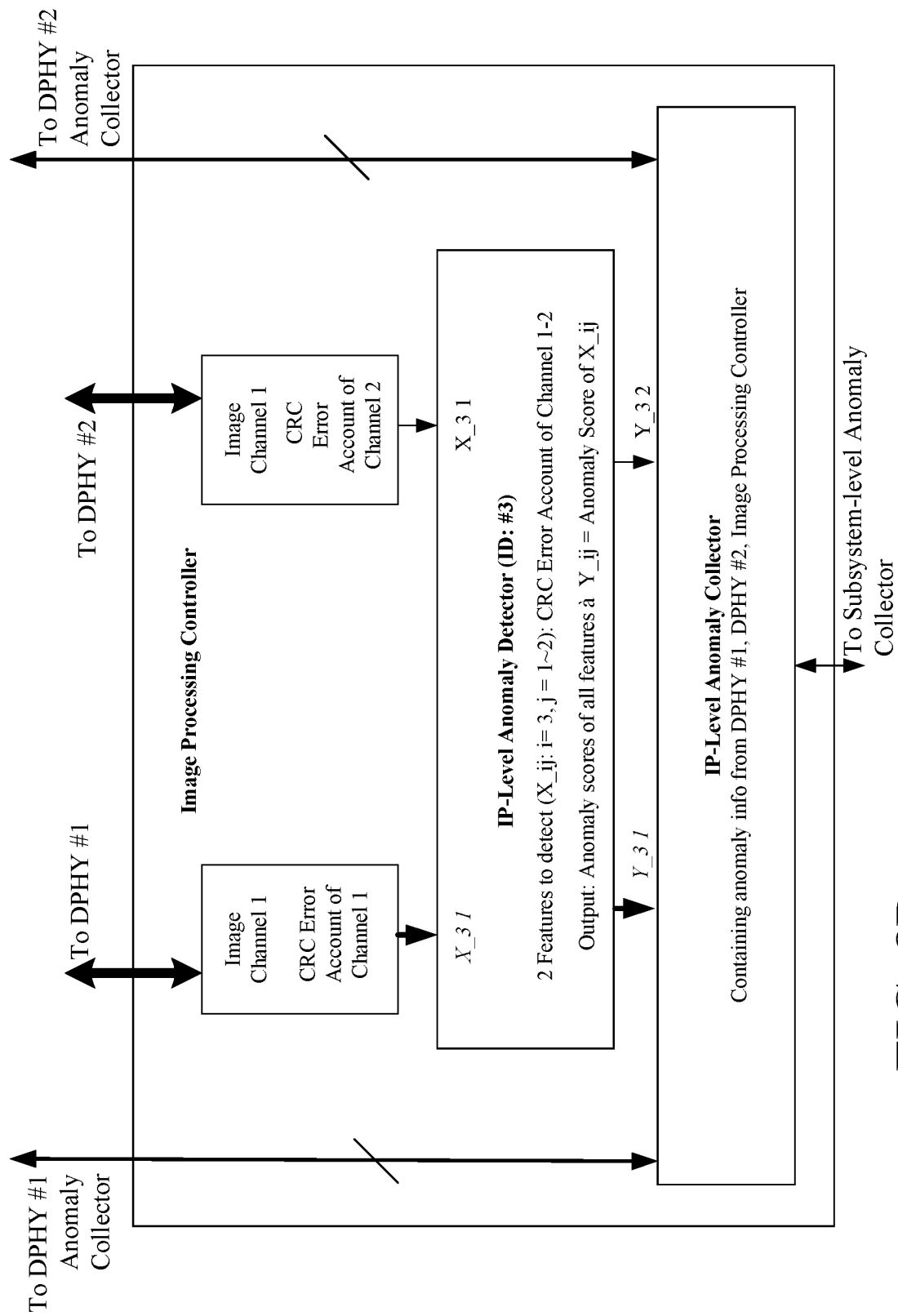
Figure 8E:
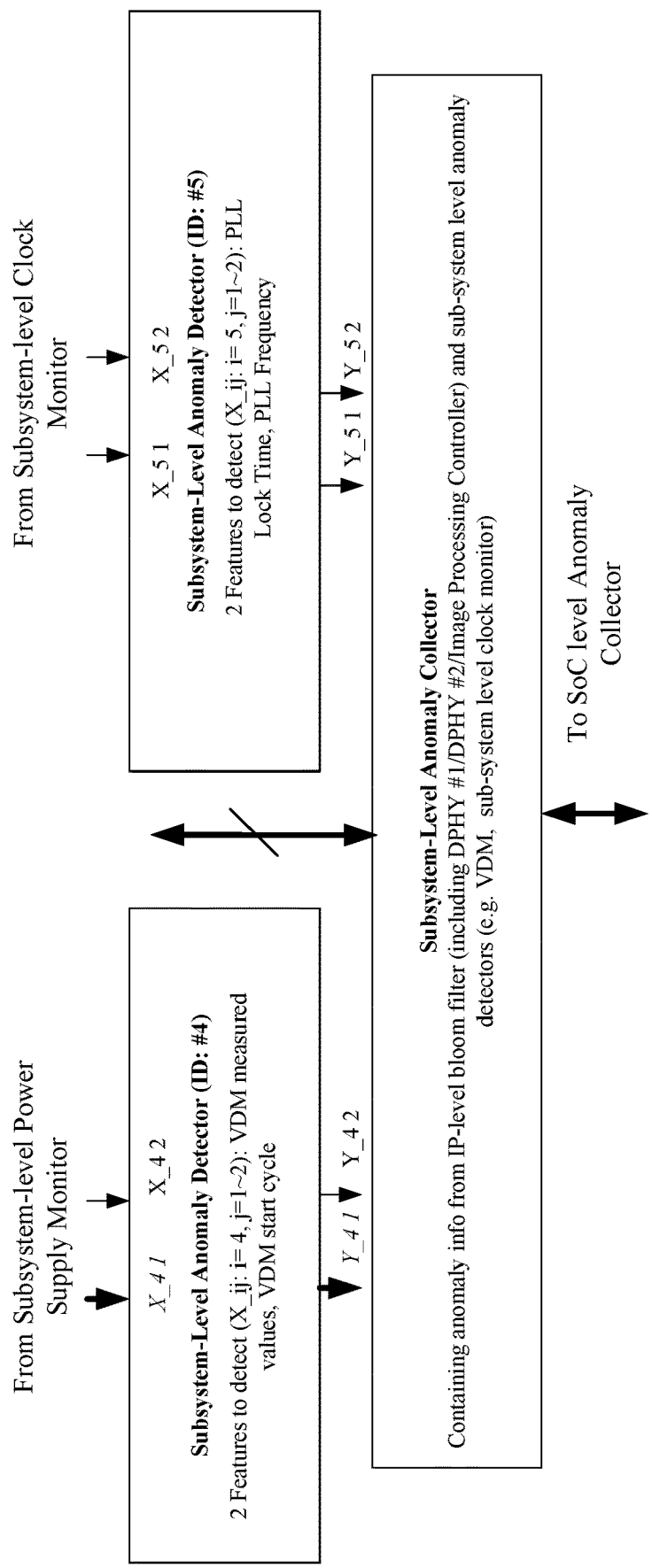
Figure 8F:
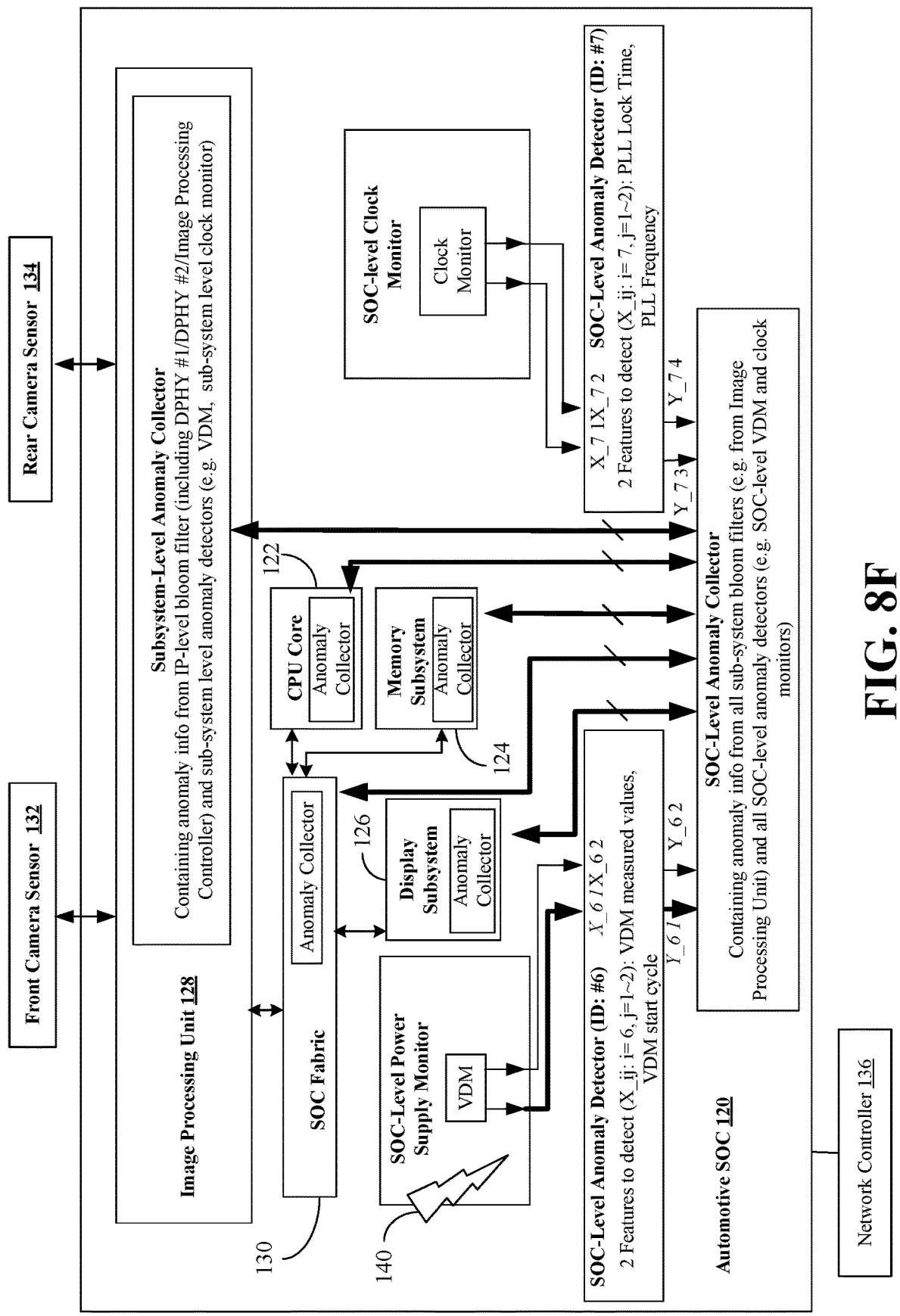

FIG. 7 shows a hierarchical plurality of redundant alarm monitors 110. In the illustrated example, if one alarm collector or any of the links to the alarm collector malfunction, the redundant alarm collector will be able to route the same information to the network. An advantage of having each alarm collector drive two ports to the parent alarm collectors is that the network redundancy is already built up from the lowest level of the hierarchy. Accordingly, integration at higher levels will be much more straightforward. For example, an SoC does not spend extra effort to create workaround routes for every alarm collector that has failed. In certain cases, however, (e.g., at the lowest hierarchical level or in the cloud level), having two ports to send out alarm information may not be possible. In such a case, waivers might be granted on a case by case basis.

The encoding of the alarms into WACs has the potential to provide an abstraction that prevents implementation details from propagating to next level networks/layers. Information hiding from next level layers is not always necessary. For example, different circuit regions/clocks within a product manufactured by the same entity may freely exchange implementation details. Whenever a proprietary boundary is encountered, some information hiding may be performed. When traversing those sensitive boundary layers, information hiding may be achieved by using a pre-negotiated and standardized representation of all sub-blocks of a particular type. This representation could be based on a signal specification published by the manufacturer.

At higher levels of the hierarchy (e.g., at networking levels), each entity may join and leave the system any time. For example, different vehicles communicating through the cloud might join or leave at any time depending on location. This procedure may be handled seamlessly in the above scheme, because when an entity joins a network, the entity can send an insertion message with a) its component ID, b) a WAC representing all subcomponents, and c) a timestamp. On receiving this message, other recipient alarm monitors will hash all of the entries in the WAC, along with its unique component ID into their respective WACs.

On leaving the network, each component may send out a delete message to others with the same information (e.g., component ID, a WAC of all subcomponents and a timestamp). On receiving the delete packet, the recipient node may hash those contents based on the component ID and delete them, which can be easily performed, because WACs support the deletion of objects.

FIGS. 8A-8F show an automotive SoC 120 (FIG. 8F) coupled to a front camera sensor 132, a rear camera sensor 134, and a network controller 136. In the illustrated example, the SoC 120 has multiple subsystems such as, for example, a CPU (central processing unit, host processor) core 122, a memory subsystem 124, a display subsystem 126, an image processing unit (IPU) 128, an SoC level fabric 130, global power and clock distribution networks, and so forth. By way of example, the image processing unit 128 includes multiple blocks (FIGS. 8A-8E). In an embodiment, the image processing unit 128 includes "hard" blocks (FIGS. 8B-8C) such as, for example, MIPI (Mobile Industry Processor Interface) camera and display physical layers (DPHYs) to receive front and rear camera sensor data, and "soft" blocks (FIG. 8D) such as, for example, an image processing controller, as well as subsystem level fabrics and components. A number of various anomaly detectors are assumed to be distributed in the lowest (e.g., "IP") level, subsystem-level and SoC-level components.

Applying the proposed anomaly communication architecture, in this example the IP-level is assigned to be "Domain 0", the subsystem level is assigned as "Domain 1" and the SoC level is assigned as "Domain 2". Multiple domain 0 (IP-level) anomaly detectors in the same subsystem (Domain 1) may send the anomaly information to a shared IP-level anomaly collector using the WAC format described herein. For example, DPHY #1 coupled to the front camera sensor 132 and DPHY #2 coupled to the rear camera sensor 134 communicate anomaly information to the image processing controller, where an anomaly collector is used to store the anomaly information of both the DPHY and controller in the WAC format described herein. This IP-level WAC further communicates information to be included in the next level (e.g., subsystem level, domain 1) WAC, which also stores the anomaly information of subsystem level components (e.g., IPU-level voltage droop monitor/VDM and clock monitors). Similarly, the domain 1 WACs from various subsystems (e.g. memory, display, CPU core), along with outputs from SoC-level anomaly detectors, are fed into the SoC-level (domain 2) WAC.

In the illustrated example, an anomaly event 138 (FIG. 8B) such as, for example, the signal eye diagram of lane #4 of the DPHY for the front camera sensor 132 shrinking (e.g., compared to normal behavior) is detected. In such a case, output Y_14 begins to present an anomaly score that is higher than a predefined threshold. This anomaly information may be captured by the IP-level WAC (FIG. 8D) inside the image processing unit 128. Also, since one lane of the DPHY channel associated with the front camera sensor 132 behaved abnormally, the CRC (cyclic redundancy check) error count observed in the image processing controller would start to increase. As a result, a high anomaly score of output Y_31 is also stored in the same IP-level WAC for both outputs Y_14 and Y_31, which may be communicated to the subsystem level WAC, and further to the SOC-level WAC. If no other anomaly was reported in the predefined time window, it might be concluded that the event 138 was a local anomaly (e.g., single DPHY lane issue due to, for example, a transient fault).

In the illustrated example, however, another anomaly event 140 (FIG. 8F) is detected in the SOC global power distribution network. In this case, such an anomalous event 140 has a cascading effect to impact the power supplies hierarchically. For example, outputs Y_61 (FIG. 8F), Y_41 (FIG. 8E), and Y_25 (FIG. 8C)/Y_19 (FIG. 8B), representing VDM measure values in SoC-level, IPU subsystem-level and IP-level, respectively, would show the high anomaly scores. All of this anomaly information may be communicated through the proposed architecture. By inquiring the SoC-level WAC, a global anomaly event may be inferred, which may trigger a higher action priority than a local event.

Figure 9:
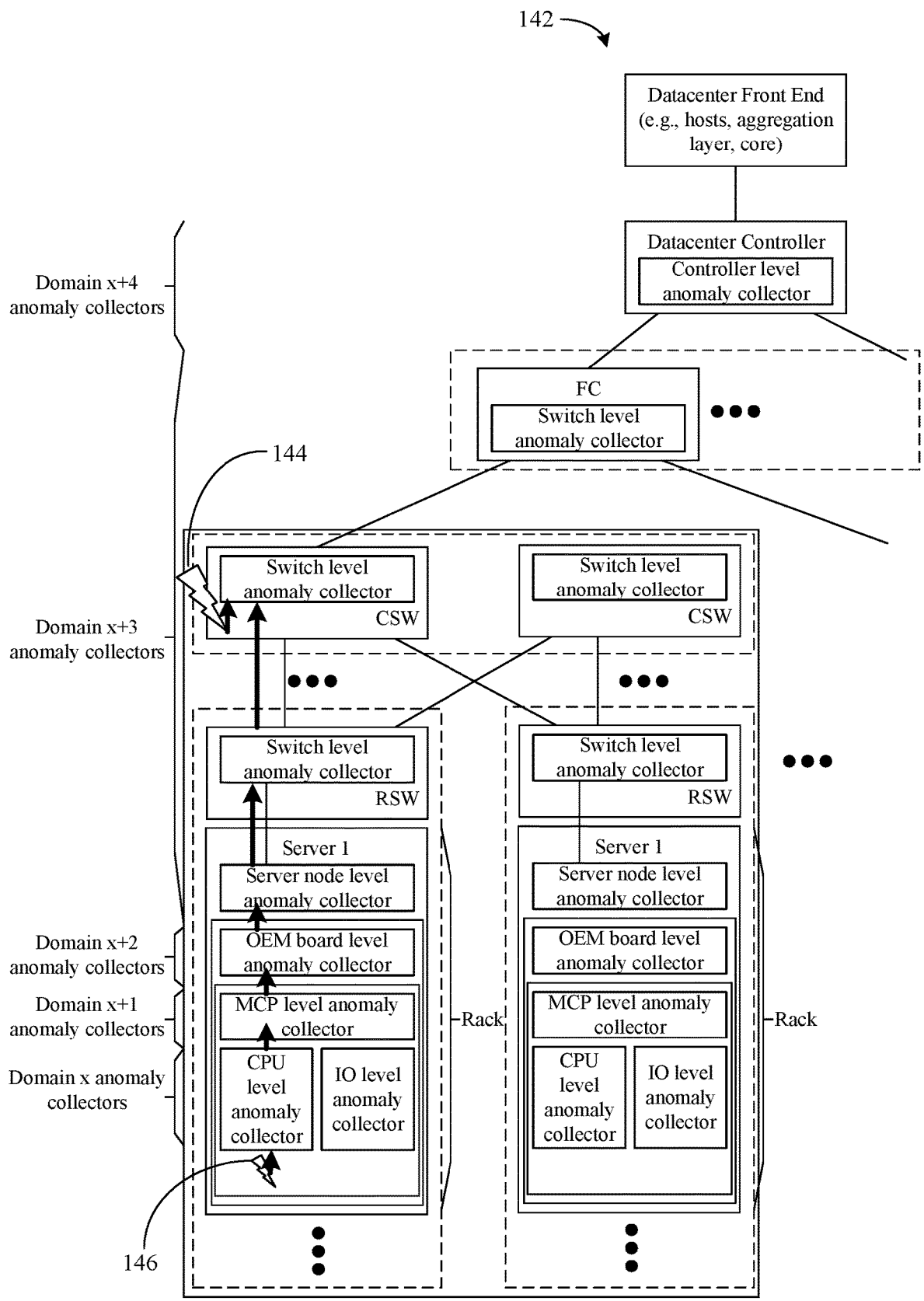
FIG. 9 is a block diagram of an example of a datacenter network cluster according to an embodiment.

FIG. 9 shows a datacenter network cluster 142 that includes several layers of switches. In the illustrated example, the network cluster 142 includes cluster level switches (CSW), rack level switches (RSW) and "fat-cat" aggregation switches (FC), connecting server racks to the front-end of the datacenter (e.g., the application level). Datacenter networks may be susceptible to transient errors in switches, wherein the transient errors manifest as latency increases and higher overall job execution times. Moreover, determining the root cause of the transient errors may be difficult. The transient errors may also cause performance degradation and may even result in downtime of the datacenter and/or violation of the service agreement. To determine the root cause of these failures, simultaneous anomaly data is made available both at the point of manifestation of the failure (e.g., the servers) and the point of origin (e.g., malfunctioning switches). The technology described herein offers a way to achieve that, by allowing individual blocks to be cognizant of anomalies throughout the network, at any instant. In the illustrated example, each switch and each component within the server rack has an anomaly collector, collecting anomaly information into a WAC format. The anomaly collectors are arranged in several domains, with each domain sending the cumulative anomaly information collected in that domain to the next higher domain. For example, Domain0 will start with the lowest level blocks, followed by domain 1, 2 . . . onwards. The top CPU level anomaly collector is at domain x, the top MCP (multi-chip package) anomaly collector is at domain x+1, the top OEM (original equipment manufacturer) board level anomaly collector is at domain x+2, the server node level anomaly collector is at domain x+3, and all of the switches (e.g., CSW, RSW, FC) are also at domain level x+3, followed by the datacenter controller at domain x+4.

If the server 1 CPU anomaly collector observes a local anomaly 146 in the form of a high number of retries at TCP/IP (Transmission Control Protocol/Internet Protocol), the CPU anomaly collector will encode the local anomaly 146 into the WAC format in domain x and transmit the encoded anomaly 146 to the WAC of the MCP. The WAC of the MCP will in turn be encoded with the anomaly 146 at domain x+1. Similarly, that WAC may be transmitted to the WAC of the OEM board (domain x+2) and then to the server node level WAC (domain x+3), where it is re-encoded into the WAC at those levels. Then, that WAC gets transmitted via the switches to the datacenter controller at domain x+4, where it is encoded into the WAC of the datacenter controller.

In the same timeframe, the CSW 1 switch may also observe a high value in its packet-drop counter. In such a case, the anomaly collector of the CSW 1 switch may encode this anomaly 144 into the WAC format and transmit the encoded anomaly 144 within the domain x+3 to the FC switch level anomaly collector. This message gets transmitted in WAC format to the datacenter controller WAC at domain x+4. Since the datacenter controller WAC has access to information about both the anomalies 144, 146, the datacenter controller may correlate these two pieces of information and conclude that there was a malfunction of CSW switch 1, due to which the server 1 was experiencing a high number of retries. In such a case, the datacenter controller may take necessary action to either temporarily bypass the CSW switch 1 for server 1 or rebalance the load of server 1 to reduce traffic through that switch.

Although FIGS. 8 and 9 describe the technology presented herein in the automotive and datacenter contexts, respectively, other applications may also be used. For example, the technology described herein may be deployed in an electronic device/system having computing functionality (e.g., personal digital assistant/PDA, notebook computer, tablet computer, convertible tablet), communications functionality (e.g., smart phone), imaging functionality (e.g., camera, camcorder), media playing functionality (e.g., smart television/TV), wearable functionality (e.g., watch, eyewear, headwear, footwear, jewelry), robotic functionality (e.g., autonomous robot), etc., or any combination thereof.

Figure 10:
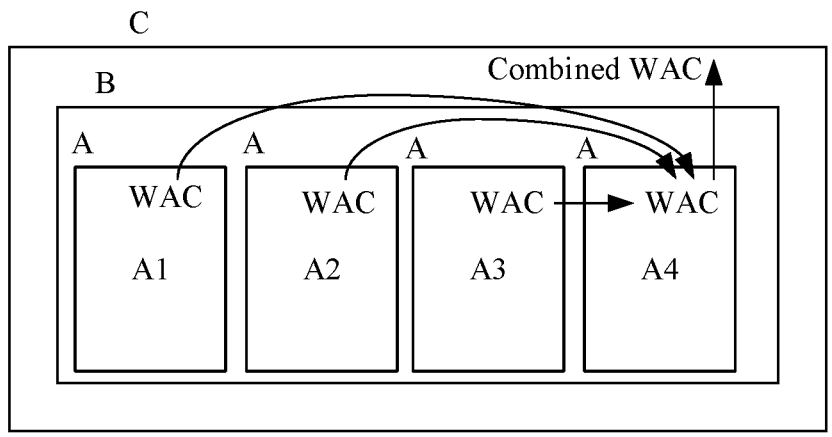
FIG. 10 is a block diagram of an example of a weighted anomaly collector hierarchy according to an embodiment.

FIG. 10 shows a WAC hierarchy 147 in which 4 similar blocks A1, A2, A3, A4 are peers in terms of design hierarchy. In the illustrated example, the blocks A1, A2, A3 have a first level WAC that is sent to A4, which creates a second level WAC and then A4 sends that WAC to higher level hierarchies. Similarly, some designs may implement a WAC network in which the WACs flow from the top to down, and the lowest design level contains the parent WAC, which contains the information of the whole system.

Figure 11:
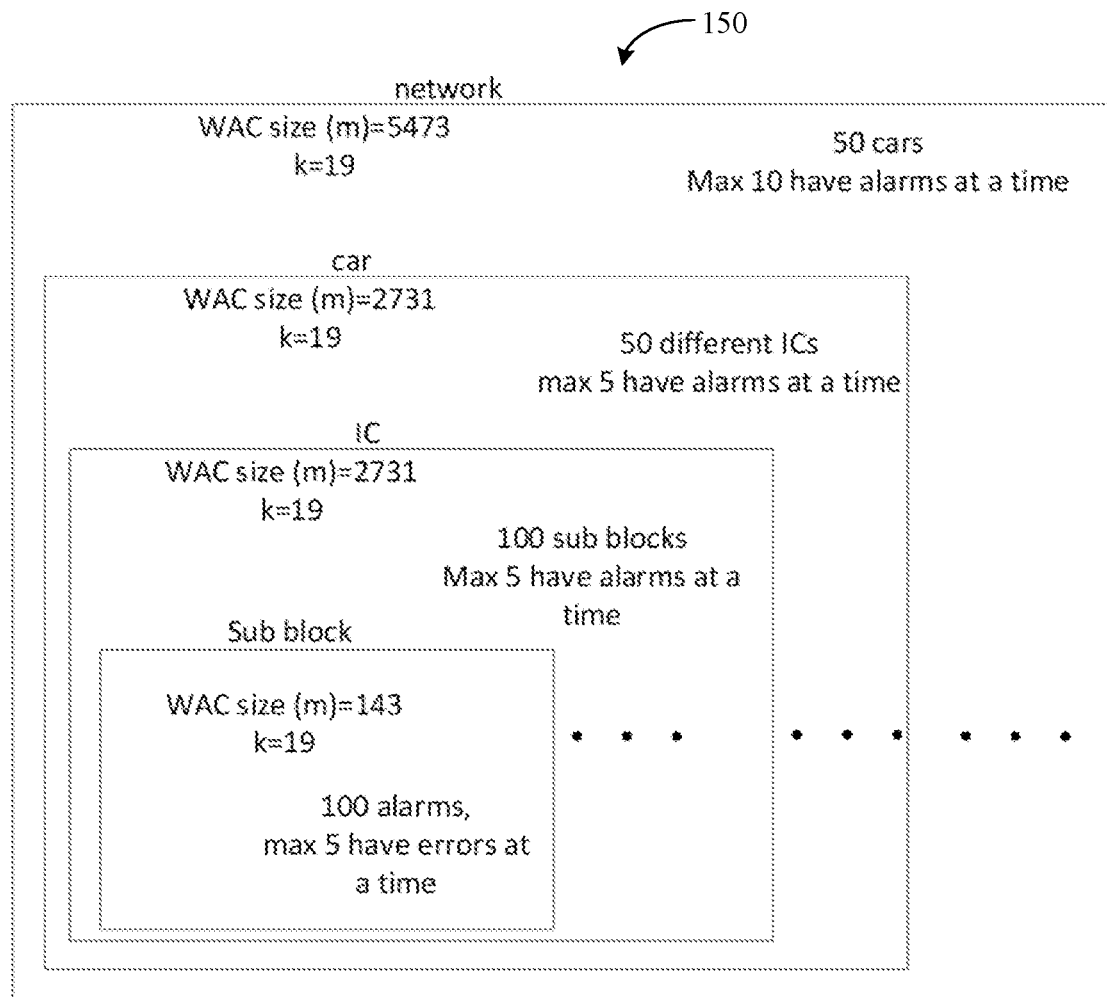
FIG. 11 is an illustration of an example of an automotive alarm hierarchy according to an embodiment.

FIG. 11 shows an automotive alarm hierarchy 150 that demonstrates the space requirements of using the WAC based architecture. In the illustrated example, a network of fifty cars occupy one road. Each car contains fifty different ICs (integrated circuits), and each IC contains 100 different sub-blocks. In the illustrated example, each sub-block contains 100 alarms, where each alarm may have a weight level of 0 . . . 7.

Assuming that from statistical analysis of representative data, within a sub-block, typically a maximum of five alarms are active at any time. Additionally, within each IC, typically only up to five sub-blocks have alarms at one time. Similarly, a maximum of five ICs within the car typically may have alarms at any time instant, and typically only up to 10 cars on the road have alarm conditions. This alarm hierarchy may be represented by a four-tier anomaly collector network.

To calculate the WAC size at each level, two equations may be used. The relationship between WAC size (m), and the number of elements stored in it (n) and the aliasing probability (p) is given by the equation $$m = 1.44n\log_2\left(\frac{1}{p}\right) \quad (1)$$

Similarly, the relationship between the number of hash functions (k), and the aliasing probability (p) is given by $$k = \log_2\left(\frac{1}{p}\right) \quad (2)$$

It may be assumed that the aliasing probability is $p=1e^{-6}$ for all levels. Then, using the equation (1) and equation (2), at a sub-block level, to represent the 100 possible alarms (max five at a time), each alarm collector has a WAC size=143, where the number of hash functions=19. At the IC level, each WAC has a size=2731, where the number of hash functions=19. At the car level, each car has a WAC of size=2731 and the number of hash functions=19. At the full network level, the cloud has a WAC of size=5474, where the number of hash functions=19. Since the WAC uses a form of counting bloom filter, for each slot, there are two bits (to count up to 0 . . . 3). Therefore, the actual number of bits used at the sub-block, IC, car and network levels will be 286, 5462, 5462 and 10948 respectively. Weights up to 0 . . . 7 may be represented using this approach with no increase in storage. Thus, the above calculations show that using the above architecture, it is possible to represent all of the alarms in the entire network without the space requirements and network traffic growing significantly.

Returning to FIG. 3, it will be appreciated that the WAC 40 may represent weights along with membership information, without any extra space requirement or aliasing probability over a standard bloom filter. For example, to determine whether an object x exists in the WAC 40 and if so, the weight of the object, the following operation sequence may be followed:

1. Determine the hashed positions of the object x. Let those be $h_1, h_2 \ldots h_k$.
2. Find the highest level (e.g., level j) for which the count >0 for all these positions. In this case, j is the highest weight possible that the object x may have. Because, otherwise the entries for level j+1 for each of these positions $h_1, h_2 \ldots h_k$ would have also been nonzero.
3. Next, for each of these positions $h_1, h_2 \ldots h_k$, look at the respective entries in level j+1. Those entries must have been set by other objects (whose weight w>j). So, those counts may be subtracted from their values in level j (because they are not set by object x), to remove the aliasing.
4. If, still, all of the values in level j for all the positions $h_1, h_2 \ldots h_k$, are nonzero, then it can be concluded that object x is present in the WAC 40 with a weight j.
5. If the answer to operation 4 was negative, repeat operations 3-4 with weight=j-1 and continue.

Figure 12:
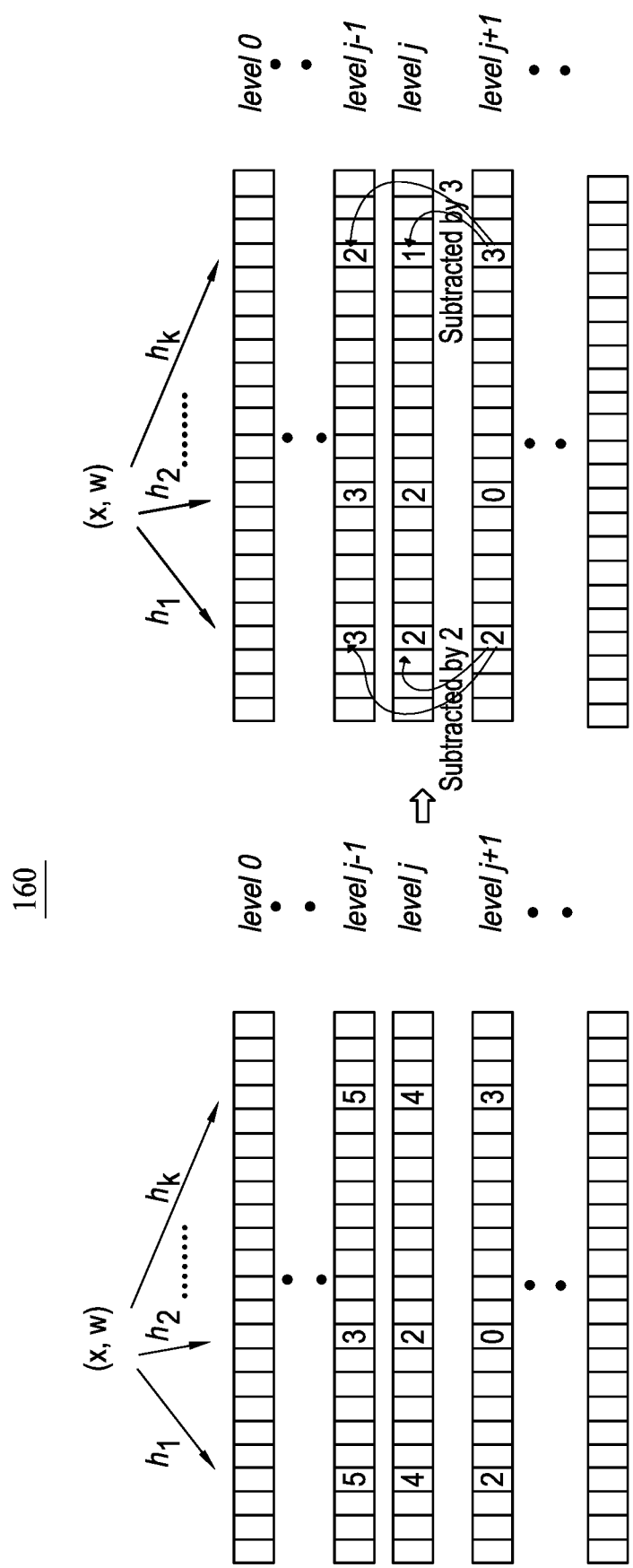
FIGS. 12 and 13 are illustrations of examples of anomaly presence determinations according embodiments.

FIG. 12 shows an example of an anomaly presence determination 160 in which the object x is hashed to three positions $h_1, h_2, h_k$. The object x cannot have weight j+1, because the count at $h_2$ for level $_j$+1 is 0. Next, a determination may be made as to whether the object x has weight=j. Since the count for $h_1$ and $h_k$ for level j+1 are 2 and 3, those values must have been set by objects other than x. Hence, the values 2 and 3 may be subtracted from the count in level j (as shown in the right), to obtain the actual count set by the object x. The counts in these three positions at level j (after the subtraction) are 2, 2, 1, so the object x could have been mapped to these three positions. Accordingly, it may be concluded that the object x is present with weight=j.

Figure 13:
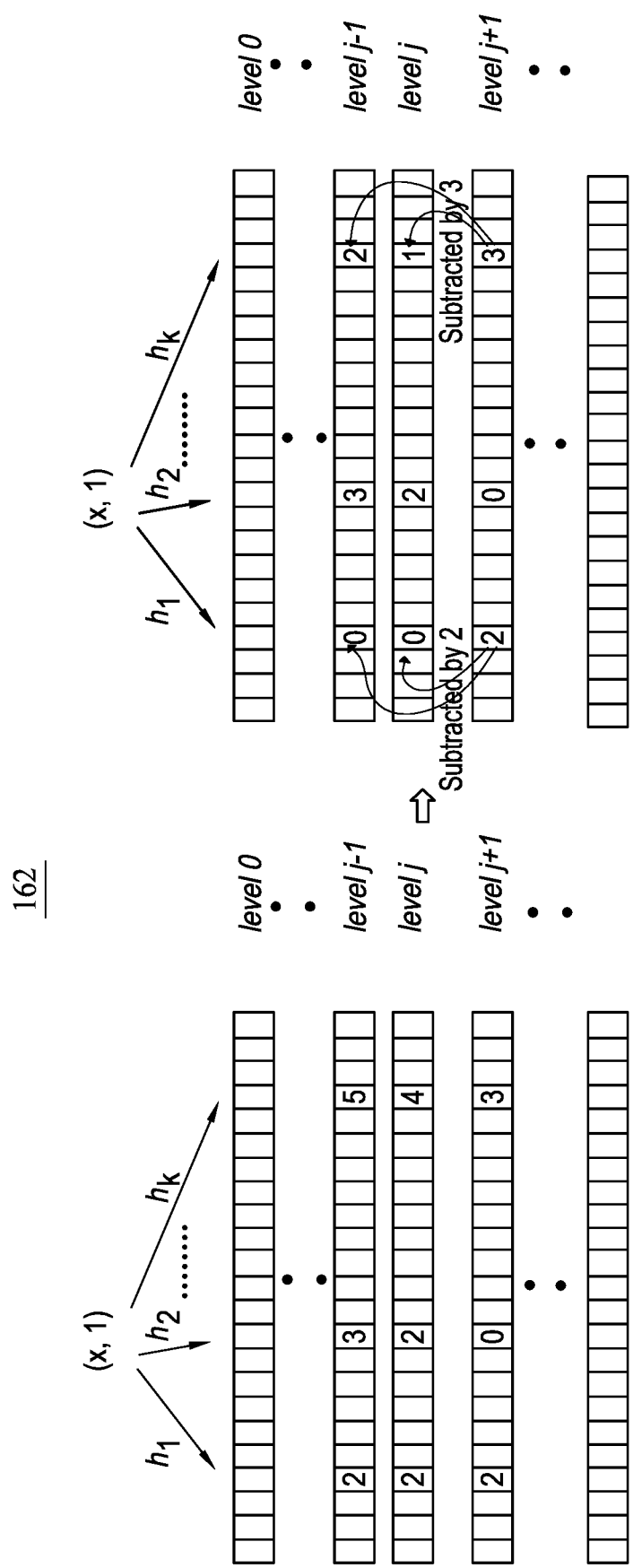

FIG. 13 shows another example of an anomaly presence determination 162 in which the object x is hashed into positions $h_1, h_2, h_k$. It appears that the object may have weight=j, because at level j, all 3 positions have non-zero counts. At level j+1, however, positions $h_1, h_k$ have the count of 2 and 3, respectively, which must have been set by other objects. Therefore, the values 2 and 3 may be subtracted from all levels equal and below level j. The result is that the count at position $h_1$ is 0 for all levels. Accordingly, it may be concluded that the object x was not hashed into this WAC.

Of particular note is that if multiple levels were not used (e.g., if the data structure was not a WAC with multiple levels of bloom filters), discovery that the object x was not present would not have been possible (e.g., because in that case, the data structure would have been only one level of bloom filter with nonzero entries at all the locations $h_1, h_2, h_k$). Accordingly, having multiple levels helps in decreasing the aliasing probability.

Returning again to FIG. 3, it may be determined that that the aliasing probability of the WAC 40 with l levels of bloom filters, with each bloom filter of size=m is the same as the aliasing probability of having a standard bloom filter with 1 level and m·l slots, provided that the probability distribution of the weights is equally distributed among levels 0 . . . l−1. This determination means that if, instead of having m slots in a single level bloom filter, the filter is split up into l layers of bloom filters with each layer having $$\frac{m}{l}$$

slots as in the WAC 40, the aliasing probability is not compromised. Rather, an additional advantage is achieved in that the WAC 40 may now represent weights from 0 . . . l−1 along with set membership. Thus, introducing weights (e.g., by using levels) does not compromise the aliasing probability or the storage requirements.

The proof below shows that the aliasing probability in the WAC 40 that has l levels of bloom filters and m slots in each level is the same as the aliasing probability in a standard bloom filter that has 1 level and m·l slots in that level.

Beginning of Proof

Assuming that an object x, with weight w is being hashed to locations ($h_1, h_2 \ldots h_k$) up to level w. In order for that object to get aliased, two conditions would be satisfied a) if any of these hashed locations have a count >0 at level w+1, the count value at level w+1 is going to be subtracted from its count in level w, and b) after operation a, all locations $h_1, h_2 \ldots h_k$ at level w would have nonzero counts. These conditions essentially imply that other objects that are causing (x, w) to be aliased, fill up the positions $h_1, h_2 \ldots h_k$ exactly up to level w. Since the hash function is mapping to m positions and l levels, the probability of setting a particular bit with a particular weight (w) is $$\frac{1}{ml}$$

(e.g., if it is assumed that all weights and all positions are equally probable).

The rest of the probability calculation proceeds similar to the probability calculation for a standard bloom filter. For example, assuming that a hash function selects each array position with equal probability, if m is the number of bits in the array, the probability that a certain bit at a certain level is not set by a certain hash function during the insertion of an element is $$\left(1 - \frac{1}{ml}\right).$$

If k is the number of hash functions and each hash function has no significant correlation to the other hash functions, then the probability that the bit is not set by any of the hash functions is $$\left(1 - \frac{1}{ml}\right)^k.$$

If n elements have been inserted, the probability that a certain bit is still 0 is $$\left(1 - \frac{1}{ml}\right)^{kn}.$$

To test membership of an element that is not in the set, each of the k array positions computed by the hash functions is 1 with a probability as above. The probability of all of the positions being 1, which would cause the algorithm to erroneously claim that the element is in the set, is often given as $$\left(1 - \left(1 - \frac{1}{ml}\right)^{kn}\right)^k \approx \left(1 - e^{\frac{-kn}{ml}}\right)^k.$$

This probability is the same as the aliasing probability of a standard bloom filter with one level with number of slots=m·l.

End of Proof

Figure 14:
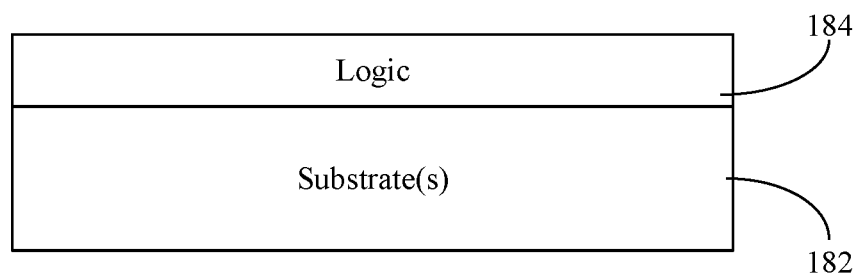
FIG. 14 is an illustration of an example of a semiconductor apparatus according to an embodiment.

FIG. 14 shows a semiconductor apparatus 180 (e.g., chip, die, package). The illustrated apparatus 180 includes one or more substrates 182 (e.g., silicon, sapphire, gallium arsenide) and logic 184 (e.g., transistor array and other integrated circuit/IC components) coupled to the substrate(s) 182. In an embodiment, the logic 184 implements one or more aspects of the method 30 (FIG. 2A), the method 50 (FIG. 2B), the method 70 (FIG. 2C) and/or the method 80 (FIG. 2D), already discussed. Thus, the logic 184 may detect the presence of an anomaly in a first domain, encode the presence of the anomaly and a weight of the anomaly into a multi-level data structure, and send the multi-level data structure to a second monitor in a second domain, wherein the second domain is located at a different hierarchical level than the first domain. The apparatus 180 therefore increases the confidence in error predictions based on anomaly information that is collected and shared across multiple hierarchical levels in a system.

The logic 184 may be implemented at least partly in configurable logic or fixed-functionality hardware logic. In one example, the logic 184 includes transistor channel regions that are positioned (e.g., embedded) within the substrate(s) 182. Thus, the interface between the logic 184 and the substrate(s) 182 may not be an abrupt junction. The logic 184 may also be considered to include an epitaxial layer that is grown on an initial wafer of the substrate(s) 182.

Additional Notes and Examples

Example 1 includes a performance-enhanced platform comprising a network controller, a plurality of sensors, and system on chip (SoC) coupled to the plurality of sensors and the network controller, the SoC including a first domain, wherein the first domain includes a first monitor to detect a presence of a first anomaly in the first domain and encode the presence of the first anomaly and a weight of the first anomaly into a first multi-level data structure.

Example 2 includes the platform of Example 1, wherein the SoC further includes a second domain, wherein the first monitor is to send the first multi-level data structure to a second monitor in the second domain, and wherein the second domain is located at a different hierarchical level in the system than the first domain.

Example 3 includes the platform of Example 2, wherein the second monitor is to receive the first multi-level data structure and one or more additional multi-level data structures associated with the first domain, and combine the first multi-level data structure and the one or more additional multi-level data structures into a second multi-level data structure.

Example 4 includes the platform of Example 3, wherein the second monitor is to detect a presence of a second anomaly in the second domain, wherein the presence of the second anomaly and a weight of the second anomaly are to be combined into the second multi-level data structure with the first multi-level data structure and the one or more additional multi-level data structures.

Example 5 includes the platform of Example 1, wherein to encode the presence and the weight of the first anomaly, the first monitor is to hash the first anomaly into a plurality of locations in a multi-level bloom filter, and increment counters at the plurality of locations in the multi-level bloom filter.

Example 6 includes the platform of Example 1, wherein the first monitor is to detect an absence of the first anomaly in the first domain, and encode the absence of the first anomaly and the weight of the first anomaly into the first multi-level data structure.

Example 7 includes a semiconductor apparatus comprising one or more substrates, and logic coupled to the one or more substrates, wherein the logic is implemented at least partly in one or more of configurable logic or fixed-functionality hardware logic, the logic coupled to the one or more substrates to detect, by a first monitor in a first domain of a system, a presence of a first anomaly in the first domain, and encode, by the first monitor, the presence of the first anomaly and a weight of the first anomaly into a first multi-level data structure.

Example 8 includes the semiconductor apparatus of Example 7, wherein the logic coupled to the one or more substrates is to send, by the first monitor, the first multi-level data structure to a second monitor in a second domain of the system, and wherein the second domain is located at a different hierarchical level in the system than the first domain.

Example 9 includes the semiconductor apparatus of Example 8, wherein the logic coupled to the one or more substrates is to receive, by the second monitor, the first multi-level data structure and one or more additional multi-level data structures associated with the first domain, and combine, by the second monitor, the first multi-level data structure and the one or more additional multi-level data structures into a second multi-level data structure.

Example 10 includes the semiconductor apparatus of Example 9, wherein the logic coupled to the one or more substrates is to detect, by the second monitor, a presence of a second anomaly in the second domain, wherein the presence of the second anomaly and a weight of the second anomaly are to be combined into the second multi-level data structure with the first multi-level data structure and the one or more additional multi-level data structures.

Example 11 includes the semiconductor apparatus of Example 7, wherein to encode the presence and the weight of the first anomaly, the logic coupled to the one or more substrates is to hash the first anomaly into a plurality of locations in a multi-level bloom filter, and increment counters at the plurality of locations in the multi-level bloom filter.

Example 12 includes the semiconductor apparatus of Example 7, wherein the logic coupled to the one or more substrates is to detect, by the first monitor, an absence of the first anomaly in the first domain, and encode, by the first monitor, the absence of the first anomaly and the weight of the first anomaly into the first multi-level data structure.

Example 13 includes at least one computer readable storage medium comprising a set of instructions, which when executed by a computing system, cause the computing system to detect, by a first monitor in a first domain of the computing system, a presence of a first anomaly in the first domain, and encode, by the first monitor, the presence of the first anomaly and a weight of the first anomaly into a first multi-level data structure.

Example 14 includes the at least one computer readable storage medium of Example 13, wherein the instructions, when executed, cause the computing system to send, by the first monitor, the first multi-level data structure to a second monitor in a second domain of the computing system, wherein the second domain is located at a different hierarchical level in the system than the first domain.

Example 15 includes the at least one computer readable storage medium of Example 14, wherein the instructions, when executed, cause the computing system to receive, by the second monitor, the first multi-level data structure and one or more additional multi-level data structures associated with the first domain, and combine, by the second monitor, the first multi-level data structure and the one or more additional multi-level data structures into a second multi-level data structure.

Example 16 includes the at least one computer readable storage medium of Example 15, wherein the instructions, when executed, cause the computing system to detect, by the second monitor, a presence of a second anomaly in the second domain, wherein the presence of the second anomaly and a weight of the second anomaly are to be combined into the second multi-level data structure with the first multi-level data structure and the one or more additional multi-level data structures.

Example 17 includes the at least one computer readable storage medium of Example 13, wherein to encode the presence and the weight of the first anomaly, the instructions, when executed, cause the computing system to hash the first anomaly into a plurality of locations in a multi-level bloom filter, and increment counters at the plurality of locations in the multi-level bloom filter.

Example 18 includes the at least one computer readable storage medium of Example 13, wherein the instructions, when executed, cause the computing system to detect, by the first monitor, an absence of the first anomaly in the first domain, and encode, by the first monitor, the absence of the first anomaly and the weight of the first anomaly into the first multi-level data structure.

Example 19 includes a method comprising detecting, by a first monitor in a first domain of a system, a presence of a first anomaly in the first domain, and encoding, by the first monitor, the presence of the first anomaly and a weight of the first anomaly into a first multi-level data structure.

Example 20 includes the method of Example 19, further including sending, by the first monitor, the first multi-level data structure to a second monitor in a second domain of the system, wherein the second domain is located at a different hierarchical level in the system than the first domain.

Example 21 includes the method of Example 20, further including receiving, by the second monitor, the first multi-level data structure and one or more additional multi-level data structures associated with the first domain, and combining, by the second monitor, the first multi-level data structure and the one or more additional multi-level data structures into a second multi-level data structure.

Example 22 includes the method of Example 21, further including detecting, by the second monitor, a presence of a second anomaly in the second domain, wherein the presence of the second anomaly and a weight of the second anomaly are combined into the second multi-level data structure with the first multi-level data structure and the one or more additional multi-level data structures.

Example 23 includes the method of Example 19, wherein encoding the presence and the weight of the first anomaly into the first multi-level data structure includes hashing the first anomaly into a plurality of locations in a multi-level bloom filter and incrementing counters at the plurality of locations in the multi-level bloom filter.

Example 24 includes the method of Example 19, further including detecting, by the first monitor, an absence of the first anomaly in the first domain, and encoding, by the first monitor, the absence of the first anomaly and the weight of the first anomaly into the first multi-level data structure.

Technology described herein may therefore combine anomaly information from various related blocks across multiple hierarchies to achieve a much higher confidence as to whether the system is drifting towards a faulty operation state. The technology also reduces the probability of a false alarm. The result is a scheme in which the various component blocks across different hierarchies can exchange early warning signs or alarms with one another in an efficient and lossless way. The alarms may contain a) binary information that implies whether a specific anomaly/alarm is active, and b) if the alarm is active, some limited information about the severity and succinct information about the anomaly. An efficient alarm representation approach is introduced, as well as an architecture to facilitate the exchange of alarm information across all modules in a system. The technology proposed here i) is efficient in space consumption and easily scales across multiple levels of hierarchies, and ii) does not miss alarms (e.g., with limited tunable probability of overestimating alarms).

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A platform comprising:
a network controller;
a plurality of sensors; and
a system on chip (SoC) coupled to the plurality of sensors and the network controller, the SoC including a first domain, wherein the first domain includes a first monitor to:
   detect a presence of a first anomaly in the first domain, and
   encode the presence of the first anomaly and a weight of the first anomaly into a first multi-level data structure of the first domain where the first anomaly is detected.

2. The platform of claim 1, wherein the SoC further includes a second domain, wherein the first monitor is to send the first multi-level data structure to a second monitor in the second domain, and wherein the second domain is located at a different hierarchical level in the system than the first domain.

3. The platform of claim 2, wherein the second monitor is to:
receive the first multi-level data structure and one or more additional multi-level data structures associated with the first domain, and
combine the first multi-level data structure and the one or more additional multi-level data structures into a second multi-level data structure.

4. The platform of claim 3, wherein the second monitor is to detect a presence of a second anomaly in the second domain, wherein the presence of the second anomaly and a weight of the second anomaly are to be combined into the second multi-level data structure with the first multi-level data structure and the one or more additional multi-level data structures.

5. The platform of claim 1, wherein to encode the presence and the weight of the first anomaly, the first monitor is to:
hash the first anomaly into a plurality of locations in a multi-level bloom filter; and
increment counters at the plurality of locations in the multi-level bloom filter.

6. The platform of claim 1, wherein the first monitor is to:
detect an absence of the first anomaly in the first domain; and
encode the absence of the first anomaly and the weight of the first anomaly into the first multi-level data structure.

7. A semiconductor apparatus comprising:
one or more substrates; and
logic coupled to the one or more substrates, wherein the logic is implemented at least partly in one or more of configurable logic or fixed-functionality hardware logic, the logic coupled to the one or more substrates to:
   detect, by a first monitor in a first domain of a system, a presence of a first anomaly in the first domain; and
   encode, by the first monitor, the presence of the first anomaly and a weight of the first anomaly into a first multi-level data structure of the first domain where the first anomaly is detected.

8. The semiconductor apparatus of claim 7, wherein the logic coupled to the one or more substrates is to send, by the first monitor, the first multi-level data structure to a second monitor in a second domain of the system, and wherein the second domain is located at a different hierarchical level in the system than the first domain.

9. The semiconductor apparatus of claim 8, wherein the logic coupled to the one or more substrates is to:
receive, by the second monitor, the first multi-level data structure and one or more additional multi-level data structures associated with the first domain; and
combine, by the second monitor, the first multi-level data structure and the one or more additional multi-level data structures into a second multi-level data structure.

10. The semiconductor apparatus of claim 9, wherein the logic coupled to the one or more substrates is to detect, by the second monitor, a presence of a second anomaly in the second domain, wherein the presence of the second anomaly and a weight of the second anomaly are to be combined into the second multi-level data structure with the first multi-level data structure and the one or more additional multi-level data structures.

11. The semiconductor apparatus of claim 7, wherein to encode the presence and the weight of the first anomaly, the logic coupled to the one or more substrates is to:
hash the first anomaly into a plurality of locations in a multi-level bloom filter; and
increment counters at the plurality of locations in the multi-level bloom filter.

12. The semiconductor apparatus of claim 7, wherein the logic coupled to the one or more substrates is to:
detect, by the first monitor, an absence of the first anomaly in the first domain; and
encode, by the first monitor, the absence of the first anomaly and the weight of the first anomaly into the first multi-level data structure.

13. At least one computer readable storage medium comprising a set of instructions, which when executed by a computing system, cause the computing system to:

detect, by a first monitor in a first domain of the computing system, a presence of a first anomaly in the first domain; and encode, by the first monitor, the presence of the first anomaly and a weight of the first anomaly into a first multi-level data structure of the first domain where the first anomaly is detected.

14. The at least one computer readable storage medium of claim 13, wherein the instructions, when executed, cause the computing system to send, by the first monitor, the first multi-level data structure to a second monitor in a second domain of the computing system, wherein the second domain is located at a different hierarchical level in the system than the first domain.

15. The at least one computer readable storage medium of claim 14, wherein the instructions, when executed, cause the computing system to:

receive, by the second monitor, the first multi-level data structure and one or more additional multi-level data structures associated with the first domain; and combine, by the second monitor, the first multi-level data structure and the one or more additional multi-level data structures into a second multi-level data structure.

16. The at least one computer readable storage medium of claim 15, wherein the instructions, when executed, cause the computing system to detect, by the second monitor, a presence of a second anomaly in the second domain, wherein the presence of the second anomaly and a weight of the second anomaly are to be combined into the second multi-level data structure with the first multi-level data structure and the one or more additional multi-level data structures.

17. The at least one computer readable storage medium of claim 13, wherein to encode the presence and the weight of the first anomaly, the instructions, when executed, cause the computing system to:

hash the first anomaly into a plurality of locations in a multi-level bloom filter; and increment counters at the plurality of locations in the multi-level bloom filter.

18. The at least one computer readable storage medium of claim 13, wherein the instructions, when executed, cause the computing system to:

detect, by the first monitor, an absence of the first anomaly in the first domain; and encode, by the first monitor, the absence of the first anomaly and the weight of the first anomaly into the first multi-level data structure.

19. A method comprising:

detecting, by a first monitor in a first domain of a system, a presence of a first anomaly in the first domain; and encoding, by the first monitor, the presence of the first anomaly and a weight of the first anomaly into a first multi-level data structure of the first domain where the first anomaly is detected.

20. The method of claim 19, further including sending, by the first monitor, the first multi-level data structure to a second monitor in a second domain of the system, wherein the second domain is located at a different hierarchical level in the system than the first domain.

21. The method of claim 20, further including:

receiving, by the second monitor, the first multi-level data structure and one or more additional multi-level data structures associated with the first domain; and combining, by the second monitor, the first multi-level data structure and the one or more additional multi-level data structures into a second multi-level data structure.

22. The method of claim 21, further including detecting, by the second monitor, a presence of a second anomaly in the second domain, wherein the presence of the second anomaly and a weight of the second anomaly are combined into the second multi-level data structure with the first multi-level data structure and the one or more additional multi-level data structures.

23. The method of claim 19, wherein encoding the presence and the weight of the first anomaly into the first multi-level data structure includes hashing the first anomaly into a plurality of locations in a multi-level bloom filter and incrementing counters at the plurality of locations in the multi-level bloom filter.

24. The method of claim 19, further including:

detecting, by the first monitor, an absence of the first anomaly in the first domain; and encoding, by the first monitor, the absence of the first anomaly and the weight of the first anomaly into the first multi-level data structure.

\* \* \* \* \*